United States Patent
Na et al.

(10) Patent No.: US 12,402,247 B2
(45) Date of Patent: Aug. 26, 2025

(54) CIRCUIT BOARD

(71) Applicant: LG INNOTEK CO., LTD., Seoul (KR)

(72) Inventors: Se Woong Na, Seoul (KR); Jung Eun Han, Seoul (KR); Moo Seong Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 280 days.

(21) Appl. No.: 18/009,453

(22) PCT Filed: Jun. 11, 2021

(86) PCT No.: PCT/KR2021/007338
§ 371 (c)(1),
(2) Date: Dec. 9, 2022

(87) PCT Pub. No.: WO2021/251795
PCT Pub. Date: Dec. 16, 2021

(65) Prior Publication Data
US 2023/0300977 A1    Sep. 21, 2023

(30) Foreign Application Priority Data
Jun. 12, 2020  (KR) .................. 10-2020-0071465

(51) Int. Cl.
*H05K 1/02*  (2006.01)
*H05K 1/11*  (2006.01)
*H05K 3/28*  (2006.01)

(52) U.S. Cl.
CPC ............ *H05K 1/0298* (2013.01); *H05K 3/28* (2013.01); *H05K 1/111* (2013.01); *H05K 1/112* (2013.01);
(Continued)

(58) Field of Classification Search
CPC ...... H05K 1/0298; H05K 3/28; H05K 3/4644; H05K 2201/0191; H05K 2201/09736;
(Continued)

(56) References Cited

U.S. PATENT DOCUMENTS

| 7,186,921 B2 * | 3/2007 | Igarashi | H05K 1/0206 |
| | | | 257/E23.173 |
| 7,193,157 B2 * | 3/2007 | Matsuda | H05K 1/0265 |
| | | | 174/254 |

(Continued)

FOREIGN PATENT DOCUMENTS

| JP | H04-151895 | 5/1992 |
| JP | 2014-045195 | 3/2014 |

(Continued)

OTHER PUBLICATIONS

International Search Report dated Sep. 29, 2021 issued in Application No. PCT/KR2021/007338.

(Continued)

*Primary Examiner* — Ishwarbhai B Patel
(74) *Attorney, Agent, or Firm* — KED & ASSOCIATES, LLP

(57) ABSTRACT

A circuit board according to an embodiment includes: an insulating layer including first to third regions; an outer layer circuit pattern disposed on an upper surface of the first to third regions of the insulating layer; and a solder resist including a first part disposed on the first region of the insulating layer, a second part disposed on the second region, and a third part disposed on the third region, wherein the outer layer circuit pattern includes: a first trace disposed on an upper surface of the first region of the insulating layer; and a second trace disposed on an upper surface of the third region of the insulating layer; wherein a height of the first trace is different from a height of the second trace; and an (Continued)

upper surface of the first part of the solder resist is positioned lower than an upper surface of the first trace.

10 Claims, 16 Drawing Sheets

(52) U.S. Cl.
CPC ............... *H05K 2201/0191* (2013.01); *H05K 2201/09736* (2013.01)

(58) Field of Classification Search
CPC ...... H05K 1/111; H05K 3/3452; H05K 3/061; H05K 3/4611
See application file for complete search history.

(56) References Cited

U.S. PATENT DOCUMENTS

| | | | |
|---|---|---|---|
| 8,426,739 B2 * | 4/2013 | Lee ..................... | H05K 1/0271 174/254 |
| 9,040,838 B2 | 5/2015 | Lee et al. | |
| 9,420,703 B2 * | 8/2016 | Hayashi ............... | H05K 1/0298 |
| 9,578,743 B2 * | 2/2017 | Nagai .................... | H05K 1/111 |
| 9,699,905 B2 * | 7/2017 | Nishida ................ | H01L 23/498 |
| 9,999,141 B2 * | 6/2018 | Baek ..................... | H05K 1/185 |
| 2010/0252304 A1 * | 10/2010 | Muramatsu ......... | H01L 23/3121 174/251 |
| 2014/0037862 A1 | 2/2014 | Lee et al. | |
| 2014/0054073 A1 | 2/2014 | Lee et al. | |

FOREIGN PATENT DOCUMENTS

| | | |
|---|---|---|
| JP | 2015-050307 | 3/2015 |
| JP | 2015-216332 | 12/2015 |
| JP | 2016-048786 | 4/2016 |
| JP | 2017-152477 | 8/2017 |
| JP | 2017-195372 | 10/2017 |
| KR | 10-2014-0018016 | 2/2014 |
| KR | 10-2014-0027731 | 3/2014 |
| KR | 10-2016-0110159 | 9/2016 |
| KR | 10-2017-0037331 | 4/2017 |
| KR | 10-2018-0113996 | 10/2018 |

OTHER PUBLICATIONS

Japanese Office Action dated May 20, 2025, issued in Application No. 2022-576532.
Korean Office Action dated Feb. 20, 2025, issued in Application No. 10-2020-0071465.

* cited by examiner

[FIG. 1A] PRIOR ART
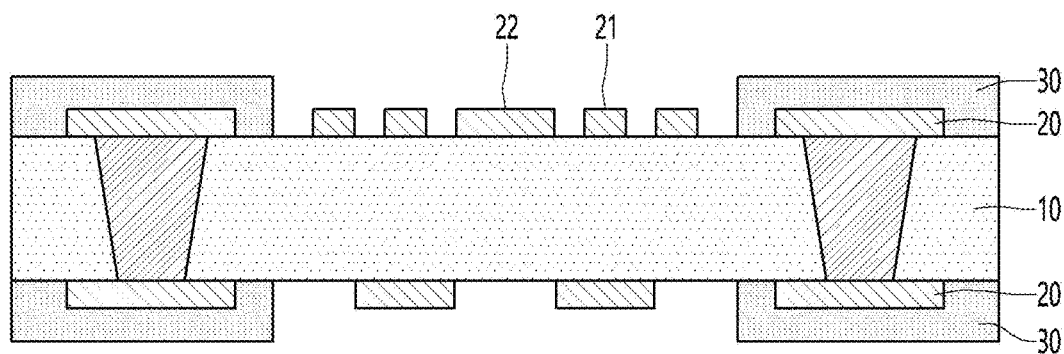
[FIG. 1B] PRIOR ART
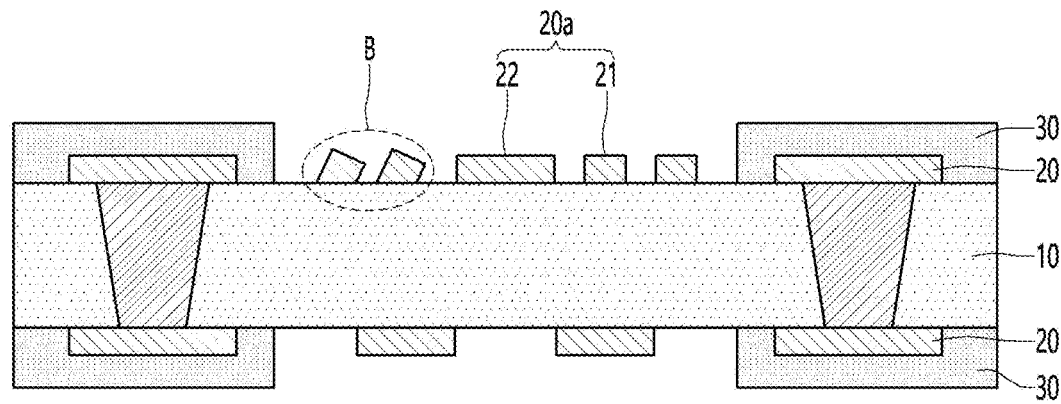

[FIG. 2] PRIOR ART
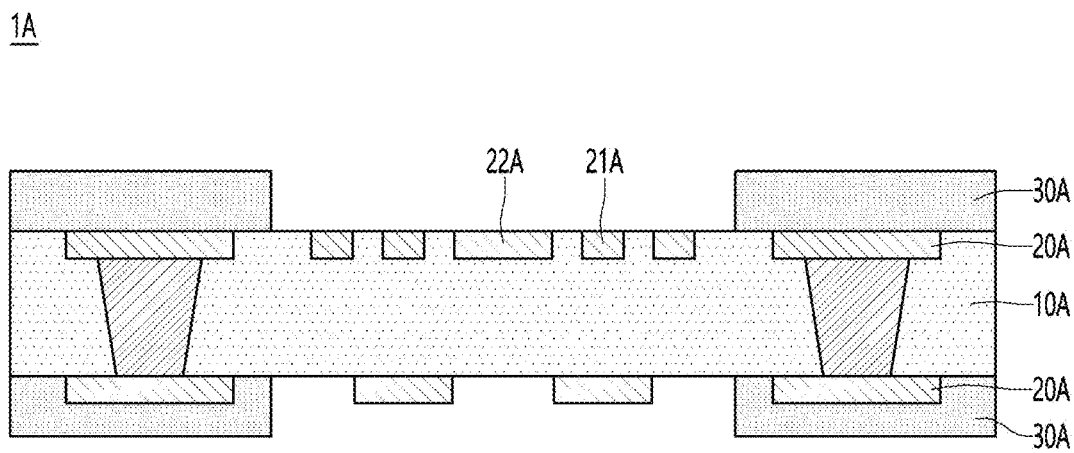

[FIG. 3]
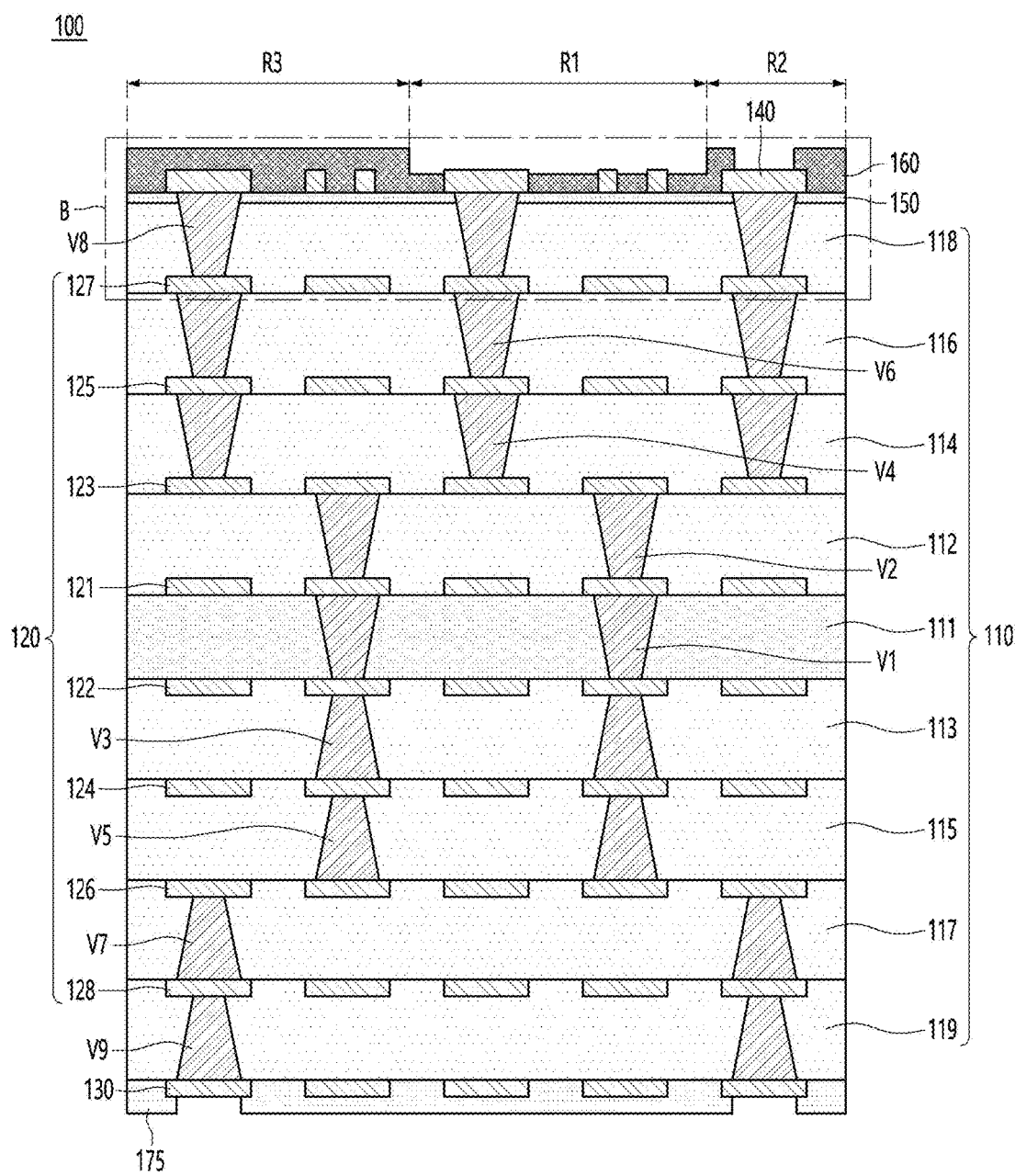

[FIG. 4]
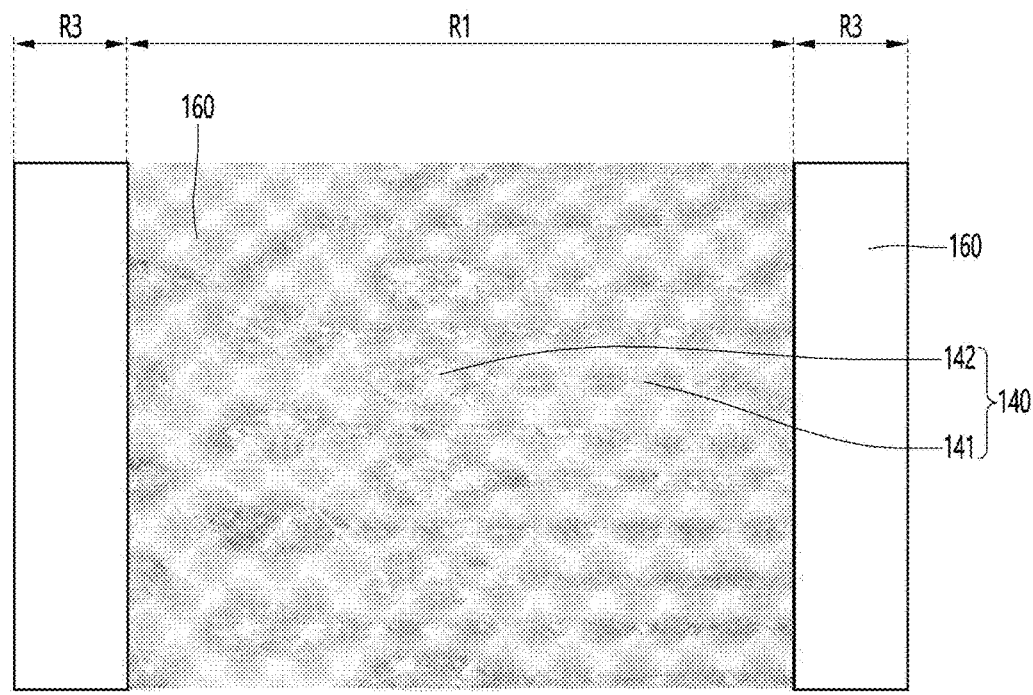
[FIG. 5]
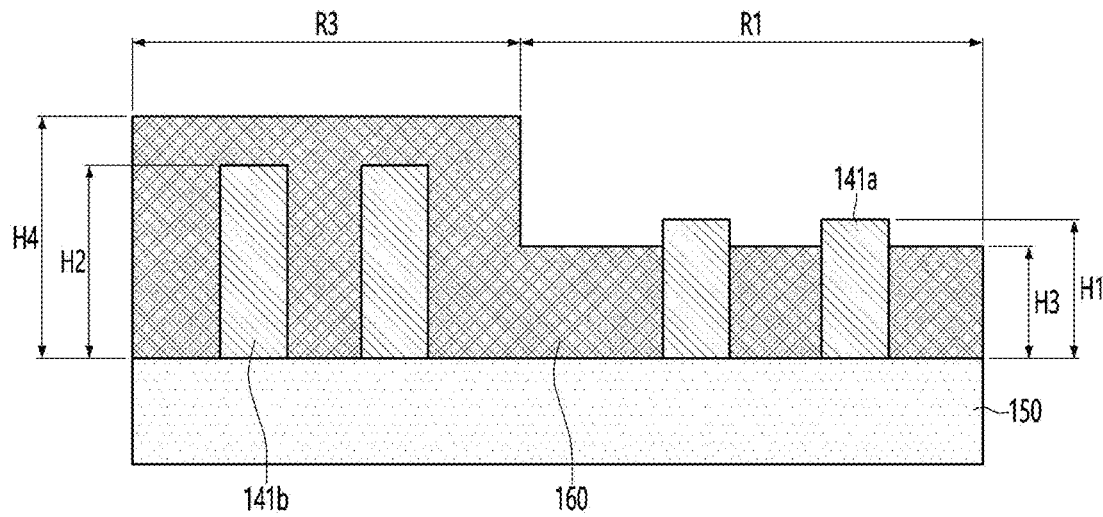

[FIG. 6]
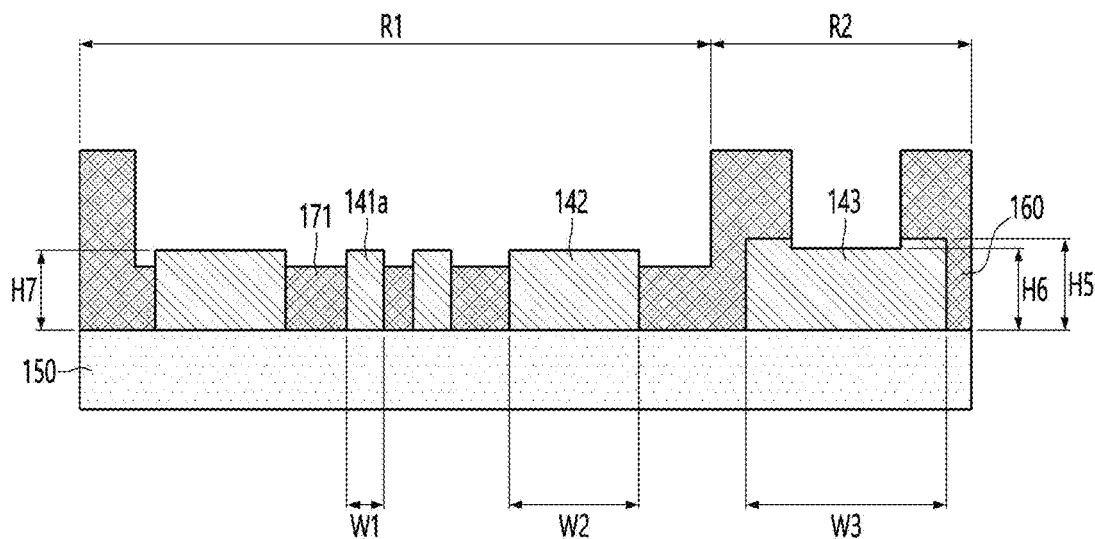

[FIG. 7A]
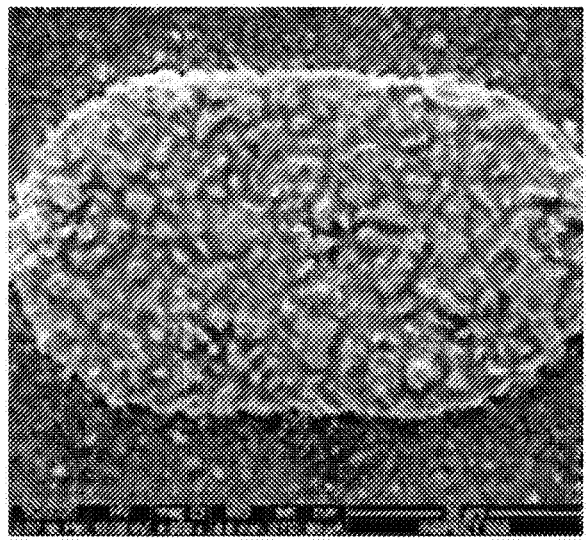
[FIG. 7B]
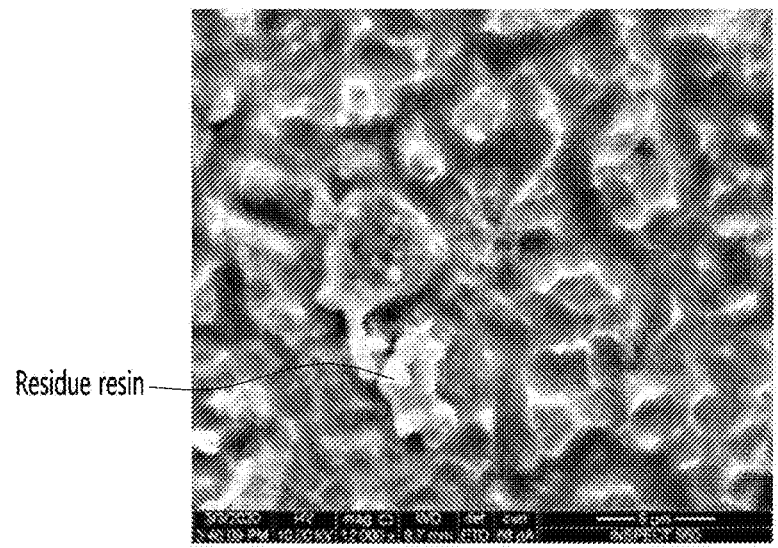
Residue resin

[FIG. 8A]
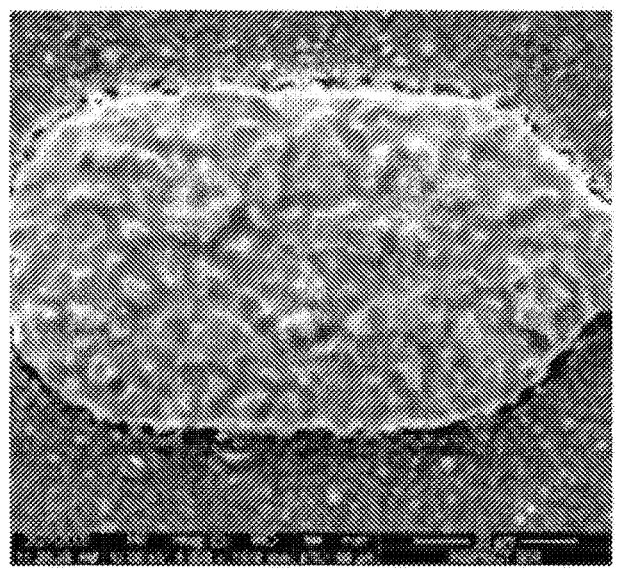
[FIG. 8B]
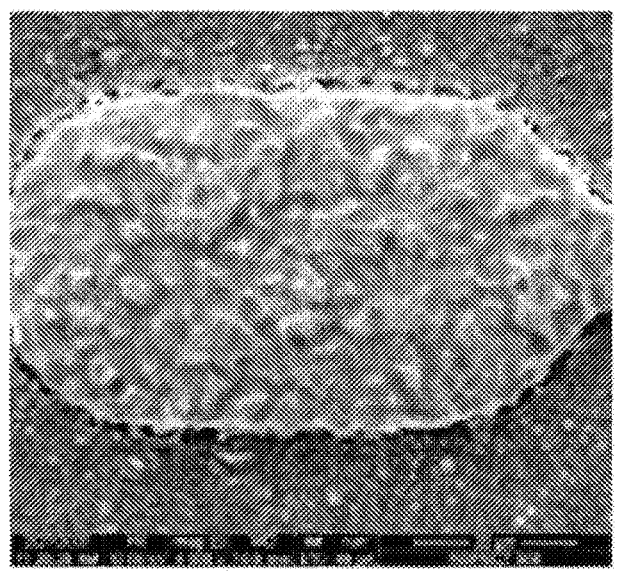

[FIG. 9A]
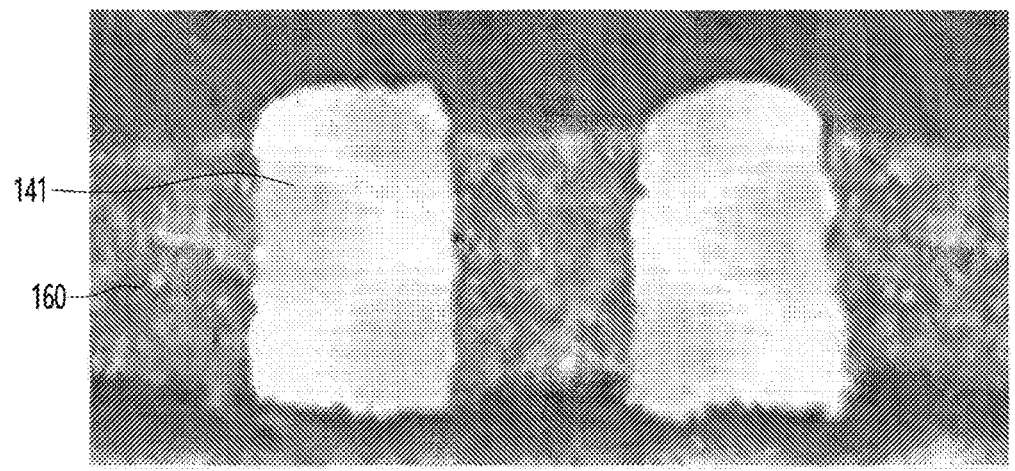
[FIG. 9B]
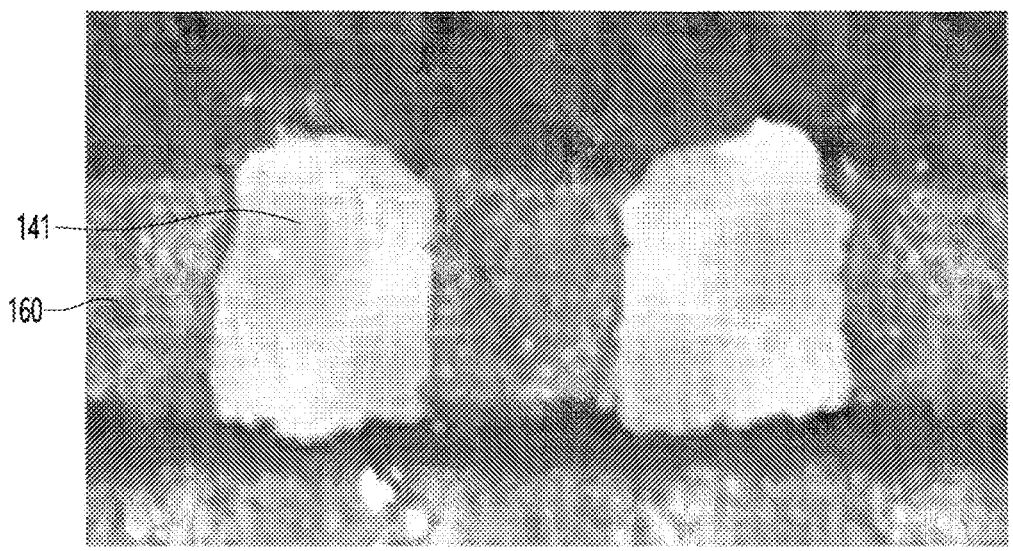

[FIG. 10]
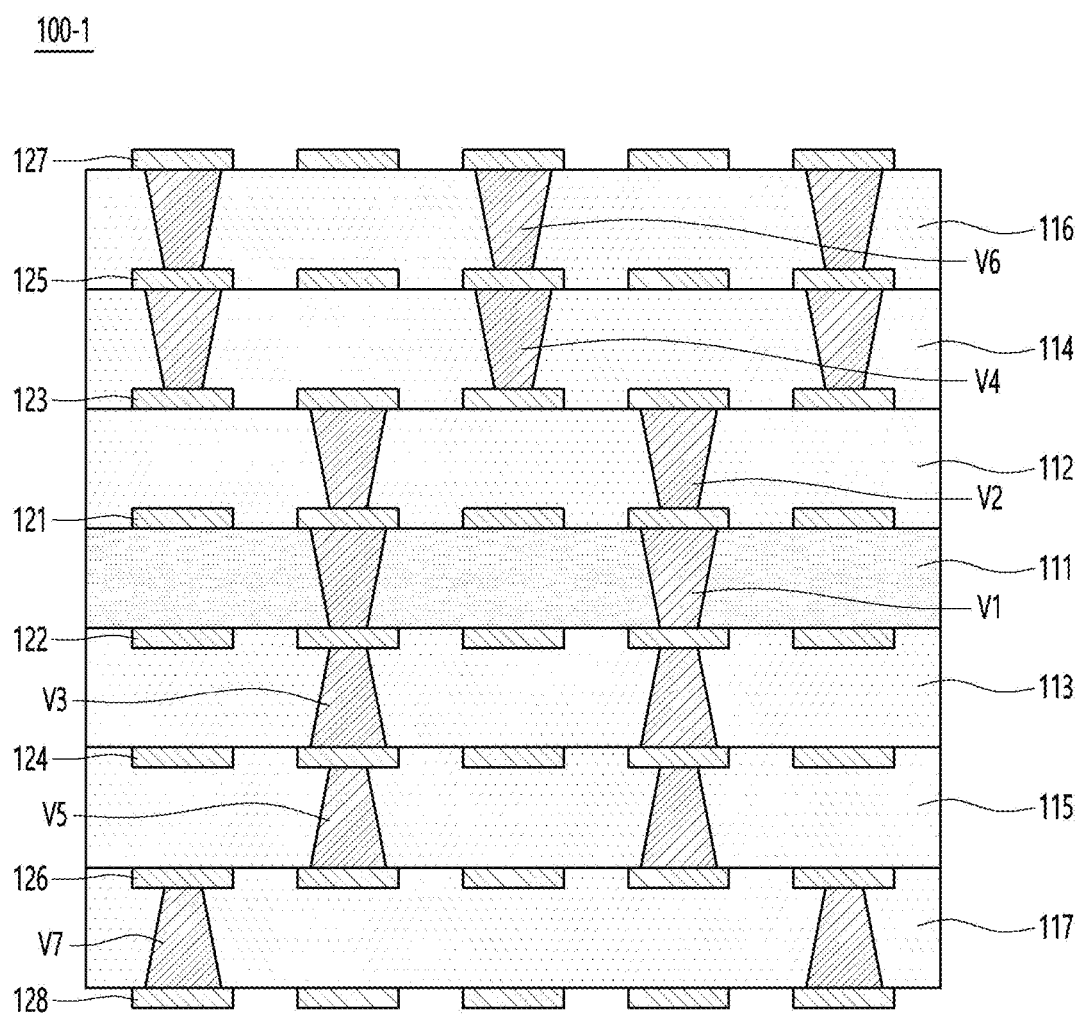

[FIG. 11]
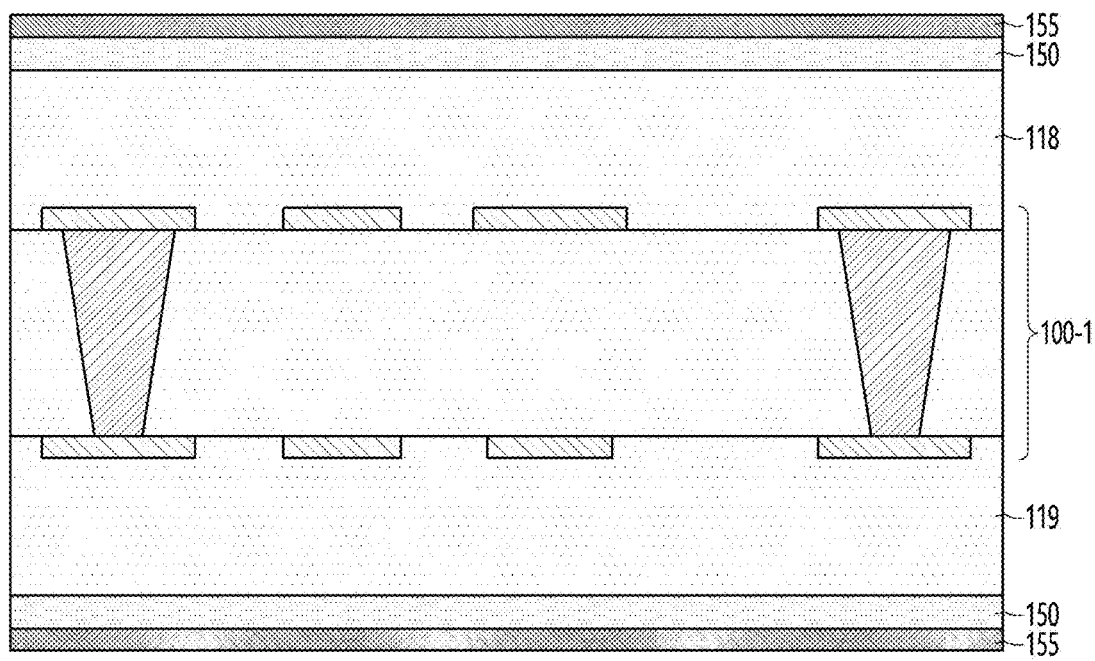

[FIG. 12]
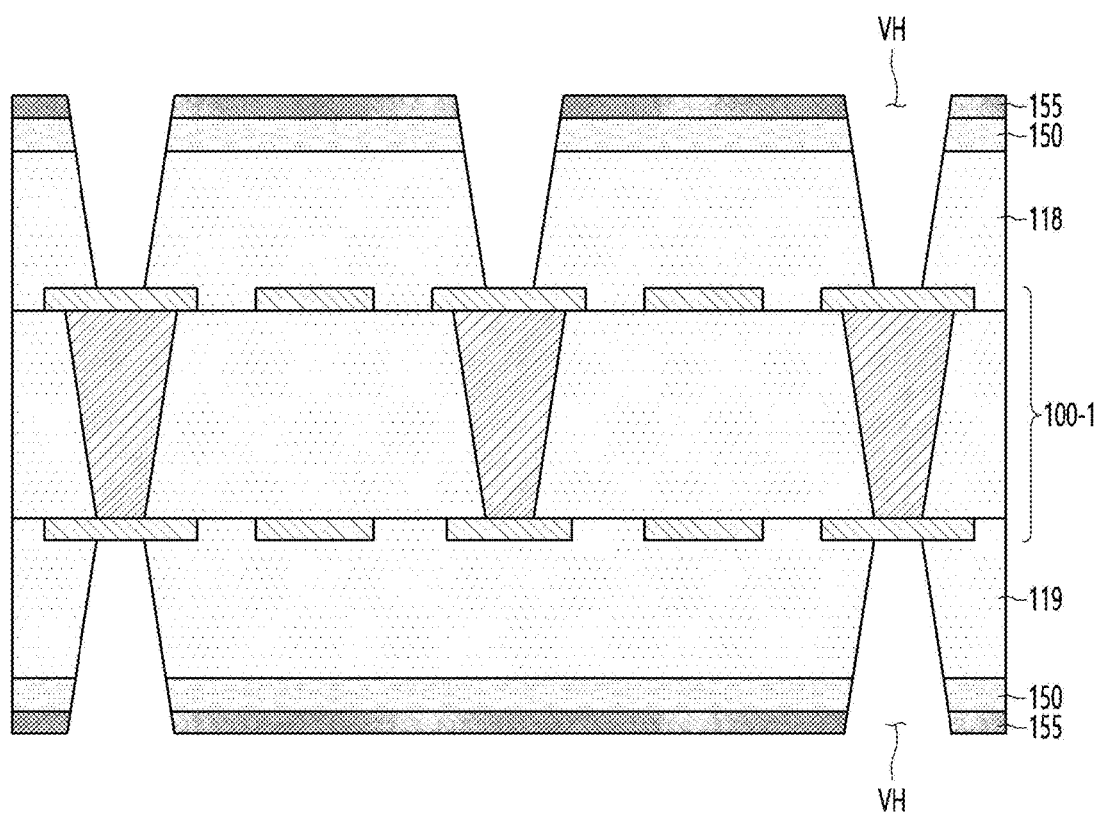

[FIG. 13]
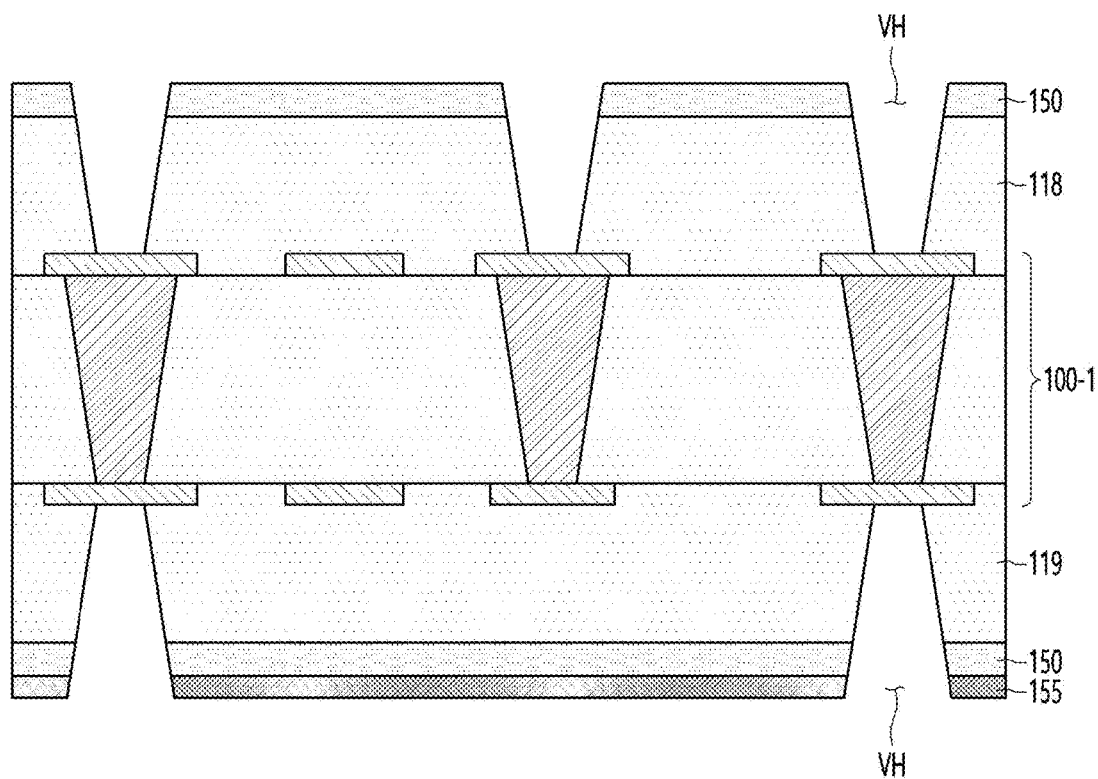

[FIG. 14]
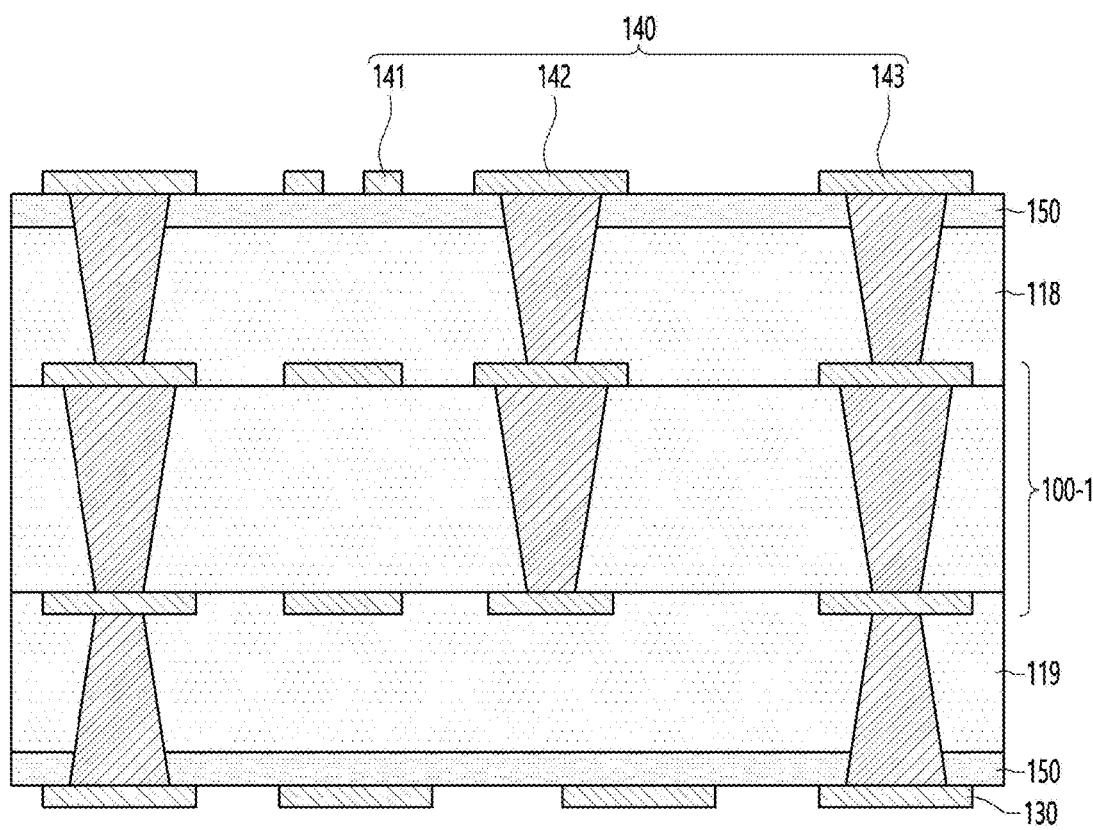

[FIG. 15]
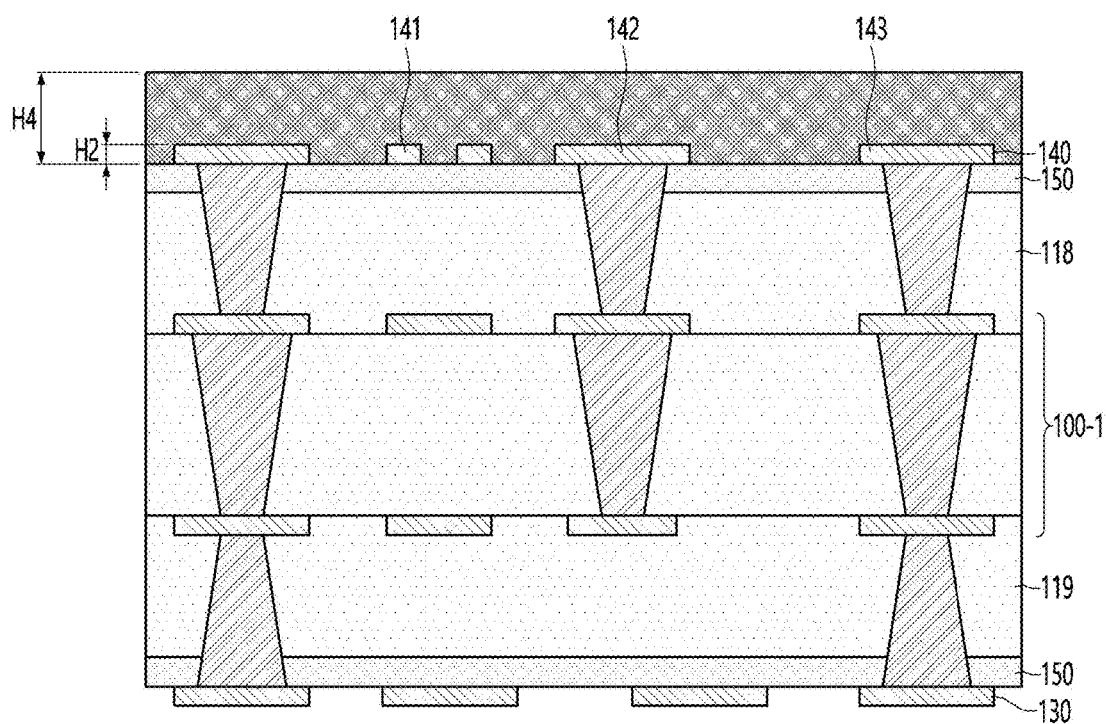

[FIG. 16]
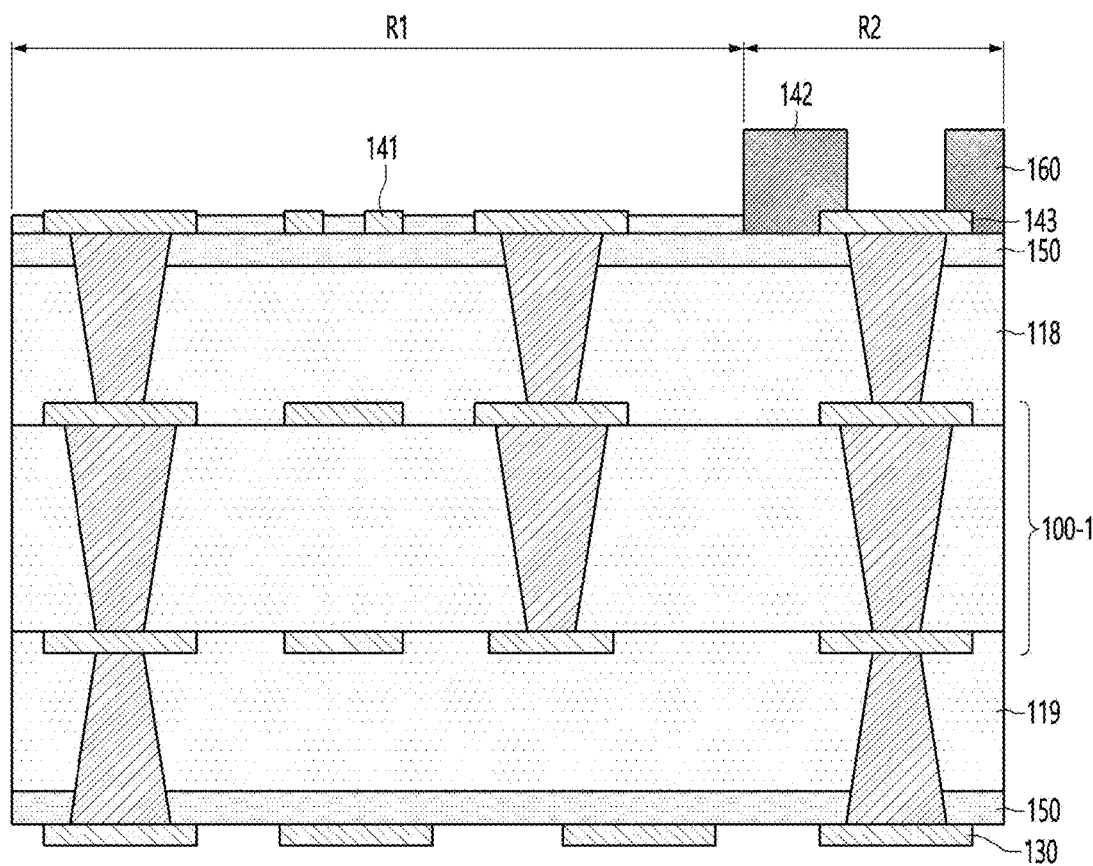

[FIG. 17]
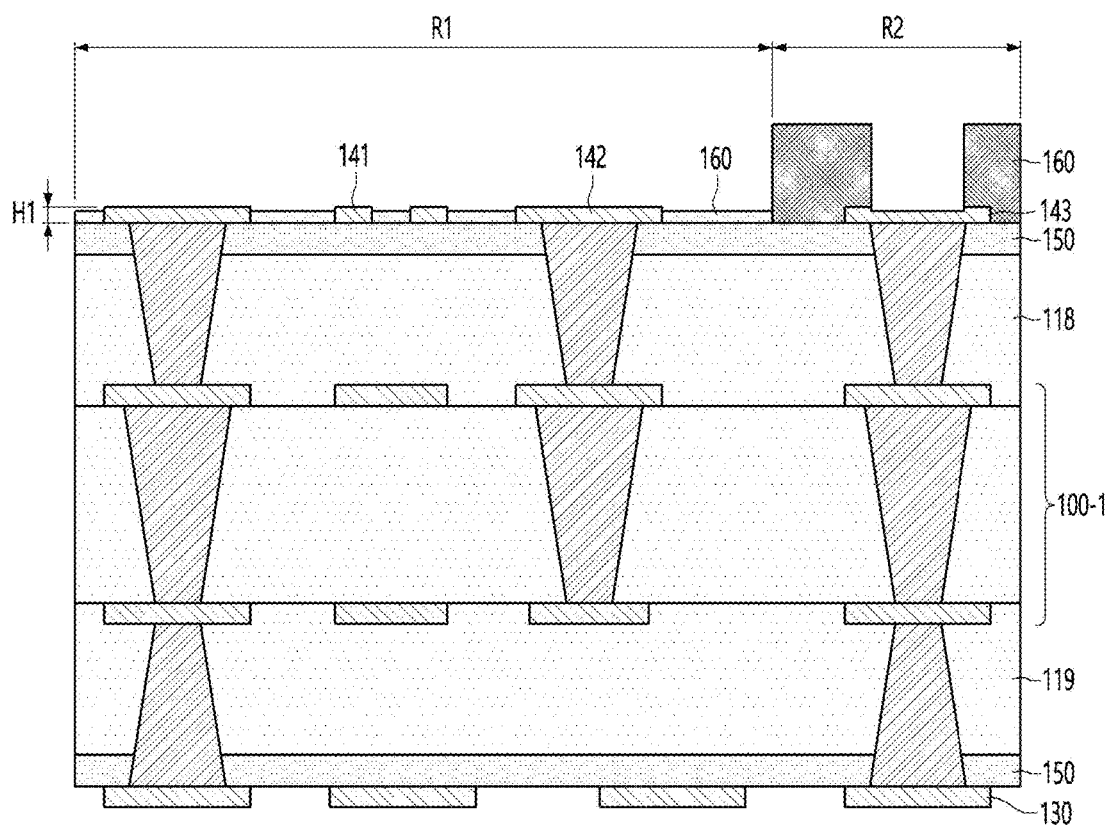

CIRCUIT BOARD

CROSS-REFERENCE TO RELATED PATENT APPLICATIONS

This application is a U.S. National Stage Application under 35 U.S.C. § 371 of PCT Application No. PCT/KR2021/007338, filed Jun. 11, 2021, which claims priority to Korean Patent Application No. 10-2020-0071465, filed Jun. 12, 2020, whose entire disclosures are hereby incorporated by reference.

TECHNICAL FIELD

The embodiment relates to a circuit board, and more particularly, to a circuit board capable of supporting an outermost circuit pattern using a solder resist.

BACKGROUND ART

As miniaturization, weight reduction, and integration of an electronic component are accelerated, a line width of a circuit has been made fine. In particular, as a design rule of a semiconductor chip is integrated on a nanometer scale, a circuit line width of a package substrate or a printed circuit board on which the semiconductor chip is mounted has been made fine to several micrometers or less.

Various methods have been proposed in order to increase the degree of circuit integration of the printed circuit board, that is, to reduce the circuit line width. For the purpose of preventing loss of the circuit line width in an etching step for forming a pattern after copper plating, a semi-additive process (SAP) method and a modified semi-additive process (MSAP) have been proposed.

Then, an embedded trace substrate (hereinafter referred to as "ETS") method for embedding a copper foil in an insulating layer in order to implement a fine circuit pattern has been used in the industry. In the ETS method, instead of forming a copper foil circuit on a surface of the insulating layer, the copper foil circuit is manufactured in an embedded form in the insulating layer, and thus there is no circuit loss due to etching and it is advantageous for making the circuit pitch fine.

Meanwhile, recently, in order to meet a demand for wireless data traffic, efforts have been made to develop an improved 5G (5th generation) communication system or a pre-5G communication system. Here, the 5G communication system uses ultra-high frequency (mmWave) bands (sub 6 GHz, 28 GHz, 38 GHz, or higher frequencies) to achieve high data transfer rates.

In addition, in order to reduce a path loss of radio waves and increase a transmission distance of radio waves in the ultra-high frequency band, in the 5G communication system, integration technologies such as beamforming, massive multi-input multi-output (massive MIMO), and array antennas have been developed. Considering that it may be composed of hundreds of active antennas of wavelengths in the frequency bands, an antenna system becomes large relatively.

Since such an antenna and AP module are patterned or mounted on the printed circuit board, low loss on the printed circuit board is very important. This means that several substrates constituting the active antenna system, that is, an antenna substrate, an antenna power feeding substrate, a transceiver substrate, and a baseband substrate, should be integrated into one compact unit.

In addition, the circuit board applied to the 5G communication system as described above is manufactured in a trend of light, thin and compact, and accordingly, the circuit pattern is becoming gradually finer.

However, a circuit board including a conventional fine circuit pattern has a structure in which a circuit pattern disposed at an outermost portion protrudes above an insulating layer, and thus there is problem that the circuit pattern of the outermost portion easily collapses.

DISCLOSURE

Technical Problem

An embodiment provides a circuit board having a new structure and a method of manufacturing the same.

In addition, the embodiment provides a circuit board capable of providing a structure including a solder resist supporting a circuit pattern disposed on an outermost side and a method of manufacturing the same.

In addition, the embodiment provides a circuit board capable of improving reliability of a circuit pattern by removing resin remaining on a surface of the circuit pattern disposed in a solder resist open region and a method of manufacturing the same.

Technical problems to be solved by the proposed embodiments are not limited to the above-mentioned technical problems, and other technical problems not mentioned may be clearly understood by those skilled in the art to which the embodiments proposed from the following descriptions belong.

Technical Solution

A circuit board according to an embodiment includes: an insulating layer including first to third regions; an outer layer circuit pattern disposed on an upper surface of the first to third regions of the insulating layer; and a solder resist including a first part disposed on the first region of the insulating layer, a second part disposed on the second region, and a third part disposed on the third region, wherein the outer layer circuit pattern includes: a first trace disposed on an upper surface of the first region of the insulating layer; and a second trace disposed on an upper surface of the third region of the insulating layer; wherein a height of the first trace is different from a height of the second trace; and an upper surface of the first part of the solder resist is positioned lower than an upper surface of the first trace.

In addition, the first trace has a first height, wherein the second trace has a second height greater than the first height; and an upper surface of the third part of the solder resist is positioned higher than an upper surface of the second trace.

In addition, the first height of the first trace satisfies a range of 90% to 95% of the second height of the second trace.

In addition, the first part of the solder resist has a third height smaller than the first height, and the third height of the first part of the solder resist satisfies a range of 70% to 85% of the first height of the first trace.

In addition, the outer layer circuit pattern includes a first pad disposed on an upper surface of the first region of the insulating layer; and the first pad has a height corresponding to the first trace.

In addition, the third height of the first part of the solder resist satisfies a range of 70% to 85% of the height of the first pad.

In addition, the outer layer circuit pattern includes a second pad disposed on an upper surface of the second region of the insulating layer, and the second part of the solder resist has an opening region exposing a part of an upper surface of the second pad.

In addition, an upper surface of the second pad includes a first portion covered by the second part of the solder resist and a second portion exposed through the opening region of the second part of the solder resist, and wherein the first portion of the second pad is positioned higher than the second portion of the second pad.

In addition, a height of the second portion of the second pad satisfies a range of 90% to 95% of a height of the first portion of the second pad.

In addition, a height of the first portion of the second pad corresponds to a height of the second trace, and a height of the second portion of the second pad corresponds to a height of the first trace.

In addition, a surface roughness of the second part and the third part of the solder resist is smaller than a surface roughness of the first part of the solder resist.

In addition, the insulating layer includes a plurality of insulating layers, and the outer layer circuit pattern protrudes from an upper surface of an uppermost insulating layer among the plurality of insulating layers, and wherein a primer layer is disposed between the uppermost insulating layer and the outer layer circuit pattern and between the uppermost insulating layer and the solder resist.

On the other hand, a method of manufacturing of the circuit board according to the embodiment includes: manufacturing an inner layer substrate; forming an uppermost insulating layer having a primer layer disposed thereon on the inner layer substrate; forming an outer layer circuit pattern on the primer layer of the uppermost insulating layer; forming a solder resist layer divided into a first region, a second region, and a third region while covering the outer layer circuit pattern on the primer layer; partially exposing and developing the solder resist layer to form a solder resist including a first part formed in the first region, a second part formed in the second region, and a third part formed in the third region; and etching an outer layer circuit pattern exposed through the first part and the second part of the solder resist, wherein the outer layer circuit pattern includes a first trace disposed in the first region; and a second trace disposed in the third region, the first trace before the etching has a first height equal to a second height of the second trace and smaller than the second height of the first trace after the etching, and wherein a first height of the first trace after the etching satisfies a range of 90% to 95% of a second height of the second trace.

In addition, an upper surface of the first part of the solder resist is positioned lower than the upper surface of the first trace, and an upper surface of the third part of the solder resist is positioned higher than an upper surface of the second trace.

In addition, the first part of the solder resist has a third height smaller than the first height, and the third height of the first part of the solder resist satisfies a range of 70% to 85% of the first height of the first trace.

In addition, the outer layer circuit pattern includes a first pad disposed in the first region, and the first pad is etched along with the first trace during the etching.

In addition, the outer layer circuit pattern includes a second pad disposed in the second region, the second part of the solder resist has an opening region exposing a part of an upper surface of the second pad, and an upper surface of the second pad includes a first portion covered by the second part of the solder resist and a second portion exposed through an opening region of the second part of the solder resist, and the second portion of the second pad is etched during the etching.

In addition, a height of the second portion of the second pad satisfies a range of 90% to 95% of a height of the first portion of the second pad.

In addition, a surface roughness of the second part and the third part of the solder resist is smaller than a surface roughness of the first part of the solder resist.

Advantageous Effects

A circuit board in the embodiment may have eight or more insulating layers. In addition, the circuit board includes an outer layer circuit pattern disposed on an outer insulating layer positioned at an uppermost portion among the insulating layers and protruding above a surface of the outer insulating layer. In this case, the outer layer circuit pattern includes a first outer layer circuit pattern disposed in a first region and a second region that is an open region where the solder resist is not disposed, and a second outer layer circuit pattern positioned in a third region where the solder resist is disposed. In this case, the second outer layer circuit pattern may be supported and protected by the solder resist, but the first outer layer circuit pattern does not have a support layer capable of supporting the first outer layer circuit pattern, and thus there is a problem that the first outer layer circuit pattern may easily collapse due to various factors.

Accordingly, the embodiment allows remaining without removing all of the solder resist in the first region and the second region, and accordingly, the first outer layer circuit pattern can be supported and protected by the solder resist. According to this, the embodiment can solve problems such as collapsing or rubbing of the first outer layer circuit pattern in the first region and the second region by miniaturizing the outer layer circuit pattern. Accordingly, the embodiment can improve product reliability. Particularly, the embodiment can solve problems such as collapsing or rubbing of a trace of the first outer layer circuit pattern in the first region. Accordingly, the embodiment can improve product reliability In addition, the embodiment allows an etching process to be performed on a surface of the second outer layer circuit patterns disposed in the first and second regions. The etching process may be a process for removing resin remaining on the surface of the second outer layer circuit patterns disposed in the first and second regions. Accordingly, in the embodiment, the resin remaining on the surface of the second outer layer circuit pattern may be completely removed through the etching process. Accordingly, the embodiment can improve the product reliability of the circuit board by improving the electrical reliability of the second outer layer circuit pattern.

In addition, an entire surface of the insulating layer or an entire surface of a primer layer in the embodiment has a structure covered by a solder resist. Accordingly, the embodiment can solve a reliability problem caused by exposing a part of a surface of the insulating layer or a part of a surface of the primer layer. In detail, the fact that a part of the surface of the insulating layer or a part of the surface of the primer layer is exposed means that a certain space exists between the outer layer circuit pattern and the solder resist. And, when the certain space exists, residual solution such as an adhesive member remains in the space, and accordingly, a reliability problem in which voids are provided by the residual solution may occur. In contrast, the embodiment may fill the space with a solder resist, thereby solving a reliability problem.

In addition, the embodiment removes the solder resist using an exposure and development method other than a sand blast or plasma method. In this case, when the solder resist is removed using a sandblasting or plasma method, deformation of the outer layer circuit pattern may occur. For example, a cross section of the outer layer circuit pattern may be deformed into a triangular shape or the like. In addition, when the outer layer circuit pattern has a triangular cross section, an adhesive member cannot be stably disposed on the outer layer circuit pattern, and thus a reliability problem may occur. In contrast, in the embodiment, the solder resist can be removed without deformation of the outer layer circuit pattern, and thus reliability can be improved.

In addition, the circuit board in the embodiment can be applied to a 5G communication system, and accordingly, transmission loss of a high frequency can be minimized, thereby further improving the reliability. Specifically, the circuit board in the embodiment can be used at the high frequency and can reduce wave loss.

DESCRIPTION OF DRAWINGS

FIGS. 1A and 1B are views showing a circuit board manufactured by an SAP method according to a comparative example.

FIG. 2 is a view showing a circuit board manufactured by a ETS method in a comparative example.

FIG. 3 is a view showing a circuit board according to an embodiment.

FIG. 4 is a plan view of a circuit board including a protective layer according to an embodiment.

FIG. 5 is an enlarged view of a trace in region B of FIG. 3.

FIG. 6 is a view showing R1 and R2 in region B of FIG. 3.

FIGS. 7A to 8B are views showing a degree of residual resin according to a degree of etching.

FIGS. 9A and 9B are views showing a shape according to an etching state of a second outer layer circuit pattern according to an embodiment.

FIGS. 10 to 17 are views showing a method of manufacturing the circuit board shown in FIG. 3 in order of process.

MODES OF THE INVENTION

Hereinafter, the embodiment disclosed in the present specification will be described in detail with reference to the accompanying drawings, but the same or similar components are designated by the same reference numerals regardless of drawing numbers, and repeated description thereof will be omitted. The component suffixes "module" and "part" used in the following description are given or mixed together only considering the ease of creating the specification, and have no meanings or roles that are distinguished from each other by themselves. In addition, in describing the embodiments disclosed in the present specification, when it is determined that detailed descriptions of a related well-known art unnecessarily obscure gist of the embodiments disclosed in the present specification, the detailed description thereof will be omitted. Further, the accompanying drawings are merely for facilitating understanding of the embodiments disclosed in the present specification, the technological scope disclosed in the present specification is not limited by the accompanying drawings, and it should be understood as including all modifications, equivalents and alternatives that fall within the spirit and scope of the present invention.

It will be understood that, although the terms "first," "second," etc. may be used herein to describe various elements, these elements should not be limited by these terms. These terms are only used to distinguish one element from another.

It will be understood that when an element is referred to as being "connected" or "coupled" to another element, it can be directly connected or coupled to the other element or intervening elements may be present. In contrast, when an element is referred to as being "directly connected" or "directly coupled" to another element, it will be understood that there are no intervening elements present.

As used herein, a singular expression includes a plural expression, unless the context clearly indicates otherwise.

It will be understood that the terms "comprise", "include", or "have" specify the presence of stated features, integers, steps, operations, elements, components and/or groups thereof disclosed in the present specification, but do not preclude the possibility of the presence or addition of one or more other features, integers, steps, operations, elements, components, and/or groups thereof.

Hereinafter, embodiments of the present invention will be described in detail with reference to the accompanying drawings.

Prior to descriptions of the present embodiment, a comparative example compared with the present embodiment will be described.

FIG. 1 is a view showing a circuit board according to a comparative example.

Referring to FIG. 1 (a), the circuit board according to the comparative example includes a circuit pattern manufactured by a general SAP method.

Specifically, the circuit board includes an insulating layer 10, a circuit pattern 20, and a protective layer 30.

The circuit pattern 20 is respectively disposed on upper and lower surfaces of the insulating layer 10.

In this case, at least one of the circuit patterns 20 disposed on a surface of the insulating layer 10 includes a fine circuit pattern.

In FIG. 1, the circuit pattern 20 disposed on the upper surface of the insulating layer 10 includes a fine circuit pattern. The fine circuit pattern includes a trace 21 that is a signal transmission wiring line and a pad 22 for mounting a chip and the like.

In this case, in the embodiment, since a supporting layer using a solder resist is formed for protecting the fine circuit pattern, a structure in a region where the fine circuit pattern is formed in the comparative example will be described.

In addition, a protective layer 30 for protecting the circuit pattern 20 is disposed on the surface of the insulating layer 10.

In this case, an upper region of the insulating layer 10 includes a first region where the protective layer 30 is disposed and a second region that is an open region where the protective layer 30 is not disposed.

Accordingly, a part of the circuit pattern 20 disposed on the upper surface of the insulating layer 10 is covered by the protective layer 30, and the remaining part is exposed to the outside without being covered by the protective layer 30.

In this case, the trace 21 and the pad 22 corresponding to the fine circuit pattern as described above are disposed in the second region that is the open region of the protective layer 30.

For example, at least one of the trace 21 and the pad 22 is formed in a width/interval of 15 μm/15 μm or less.

In this case, when the circuit pattern formed in the open region of the protective layer 30 is a pattern having a width exceeding 15 μm rather than a fine circuit pattern, the circuit pattern may be strong against external impact.

However, as shown in FIG. 1 (b), as the circuit pattern gradually becomes finer, the width and interval of the trace 21 and the pad 22, which are the fine circuit patterns of the outermost layer, gradually decrease, and accordingly, when the fine circuit pattern protruding above the upper surface of the insulating layer 10 is disposed in the second region that is the open region of the protective layer, there is a problem that the fine circuit pattern easily collapses due to an external impact.

That is, as in B of FIG. 1 (b), the trace 21 corresponding to the fine circuit pattern of the outermost layer has an extremely fine pattern shape, and thus a problem of easily collapsing or rubbing occurs even with a small external impact.

Meanwhile, recently, the fine circuit pattern disposed in the open region of the protective layer while having a structure buried in the insulating layer is formed by using a ETS method.

FIG. 2 is a view showing a circuit board manufactured by an ETS method in a comparative example.

Referring to FIG. 2, specifically, the circuit board includes an insulating layer 10A, a circuit pattern 20A, and a protective layer 30A.

The circuit pattern 20A is respectively disposed on upper and lower surfaces of the insulating layer 10A.

In this case, at least one of the circuit patterns 20A disposed on a surface of the insulating layer 10A includes a fine circuit pattern.

Here, when the circuit pattern is formed by the ETS method, the circuit pattern formed at first has a structure buried in the insulating layer 10A. Accordingly, when the circuit pattern formed at first is formed as a fine circuit pattern, the fine circuit pattern may have a structure in which the fine circuit pattern is buried in the insulating layer 10A even in Comparative example.

That is, the circuit board manufactured by the ETS method includes a fine circuit pattern having a structure buried in the surface of the insulating layer 10A. That is, the fine circuit pattern includes a trace 21A that is a signal transmission wiring line and a pad 22A for mounting a chip or the like.

In addition, when the circuit board is manufactured by the ETS method as described above, since the fine circuit pattern has the structure buried in the insulating layer, the fine circuit pattern may be protected from an external impact.

In this case, for a substrate having a two-layer structure (based on the number of layers of the circuit pattern) as in FIG. 2, there is no major problem in manufacturing the circuit board by the ETS method. However, in case of manufacturing a circuit board having eight or more layers, in particular, ten or more layers by the ETS method, a lead time for manufacturing the same takes at least 2 months or more, and thus there is a problem that productivity is lowered.

In addition, in order to manufacture the fine circuit pattern of the buried structure by the ETS method, the fine circuit pattern should be formed at first during a manufacturing process of a multilayer circuit board. In addition, recently, in order to be applied to an AP module having high integration/high specification, etc., a circuit board having eight to ten layers are required. In this case, in a process of forming the fine circuit pattern at first during the ETS process and then performing a multilayer stacking process, damage is applied to the fine circuit pattern due to a thermal stress, etc., and thus there is a problem that it is difficult to normally implement the fine circuit pattern.

In addition, when the circuit board is manufactured by the ETS method, an ETS core layer is separately required. In this case, when the circuit board is manufactured by the ETS method, an additional process for finally removing the ETS core layer is required.

In addition, when the circuit board is manufactured by the ETS method, there is a problem that a yield is lowered due to a cumulative tolerance when layers are stacked more than a certain number of times, and accordingly, product costs increase, and there is a problem that pattern damage increases due to stress as the stacking process is respectively performed on both surfaces around the ETS core layer.

In addition, with the development of 5G technology in recent years, interest in circuit boards that may reflect the same is increasing. In this case, in order to apply the 5G technology, the circuit board should have a high multi-layer structure, and accordingly, the circuit pattern should be made fine. However, in Comparative example, it is possible to form the fine pattern, but there is a problem that it is not possible to stably protect the fine pattern.

Accordingly, the embodiment is directed to providing a circuit board of a new structure capable of solving the reliability problem of the fine pattern disposed at the outermost portion and a control method thereof.

FIG. 3 is a view showing a circuit board according to an embodiment, FIG. 4 is a plan view of a circuit board including a protective layer according to an embodiment, FIG. 5 is an enlarged view of a trace in region B of FIG. 3, and FIG. 6 is a view showing R1 and R2 in region B of FIG. 3.

Prior to descriptions of FIGS. 3 to 6, the circuit board according to the embodiment may have a multilayer structure. Preferably, the circuit board according to the embodiment may have a structure of ten or more layers based on a number of layers of the circuit pattern. However, this is merely an example and the embodiment is not limited thereto. That is, the circuit board in the embodiment may have a number of layers smaller than ten layers, or alternatively, the circuit board may have a number of layers greater than ten layers.

However, the circuit board in the embodiment is for solving problems of the ETS method in the comparative example. In this case, the ETS method in Comparative example has many problems in manufacture a circuit board having eight or more layers, and accordingly, the embodiment will be described as having a ten-layer structure for comparison therewith.

Referring to FIGS. 3 to 6, a circuit board 100 includes an insulating layer 110.

Preferably, the circuit board 100 may include first to ninth insulating layers 111, 112, 113, 114, 115, 116, 117, 118, and 119 in order to implement a ten-layer structure.

In this case, the first insulating layer 111, the second insulating layer 112, the third insulating layer 113, the fourth insulating layer 114, the fifth insulating layer 115, the sixth insulating layer 116, and the seventh insulating layer 117 of the insulating layer 110 may be an internal insulating layer disposed inside in a stacked insulating layer structure, and the eighth insulating layer 118 may be an uppermost insulating layer (a first outermost insulating layer) disposed on an inner insulating layer, and the ninth insulating layer 119 may be a lowermost insulating layer (a second outermost insulating layer) disposed under the inner insulating layer.

The first insulating layer 111 may be a core insulating layer disposed at a center in the stacked structure of the insulating layer 110. The second insulating layer 112, the fourth insulating layer 114, the sixth insulating layer 116, and the eighth insulating layer 118 may be upper insulating layers sequentially disposed on the first insulating layer 111. In addition, the third insulating layer 113, the fifth insulating layer 115, the seventh insulating layer 117, and the ninth insulating layer 119 may be lower insulating layers sequentially disposed under the first insulating layer 111.

The insulating layer 110 may be a substrate on which an electric circuit capable of changing wiring is formed and may include all of a printed circuit board, a wiring board, and an insulating substrate made of an insulating material capable of forming circuit patterns on a surface thereof.

For example, the insulating layer 110 may be rigid or flexible. For example, the insulating layer 110 may include glass or plastic. Specifically, the insulating layer 110 may include a chemically tempered/semi-tempered glass, such as soda lime glass, aluminosilicate glass, etc., a tempered or flexible plastic such as polyimide (PI), polyethylene terephthalate (PET), propylene glycol (PPG), polycarbonate (PC), etc., or sapphire.

Further, the insulating layer 110 may include an optically isotropic film. As an example, the insulating layer 110 may include cyclic olefin copolymer (COC), cyclic olefin polymer (COP), optically isotropic PC, optically isotropic polymethylmethacrylate (PMMA), or the like.

In addition, at least one of the insulating layer 110 may be partially bent while having a curved surface. That is, at least one of the insulating layer 110 may partially have a plane and may partially be bent while having a curved surface. Specifically, an end portion of at least one of the insulating layer 110 may be bent while having a curved surface, or bent or crooked while having a surface with a random curvature.

In addition, at least one of the insulating layer 110 may be a flexible substrate having flexibility. Further, at least one of the insulating layer 110 may be a curved or bent substrate. In this case, at least one of the insulating layer 110 may form a wiring layout for electrical wirings which connect circuit components based on a circuit design, and electrical conductors may be disposed on an insulating material. Further, electrical components may be mounted on at least one of the insulating layer 110, and the insulating layer 110 may form wirings configured to connect the electrical components to make a circuit, and may mechanically fix the components besides functioning to electrically connect the components.

A circuit pattern may be disposed on a surface of the insulating layer 110.

That is, circuit patterns may be disposed on respective surfaces of the first to ninth insulating layers 111, 112, 113, 114, 115, 116, 117, 118, and 119 constituting the insulating layer 110.

Here, the circuit pattern may include an inner layer circuit pattern 120 and outer layer circuit patterns 130 and 140. The inner layer circuit pattern 120 may be a circuit pattern disposed inside the insulating layer 110 in the stacked structure of the circuit board, and the outer layer circuit patterns 130 and 140 may be a circuit pattern disposed on an outermost side of the insulating layer 110 in the stacked structure of the circuit board.

The inner layer circuit pattern 120 may include a first circuit pattern 121, a second circuit pattern 122, a third circuit pattern 123, a fourth circuit pattern 124, a fifth circuit pattern 125, and a sixth circuit pattern 126, and a seventh circuit pattern 127.

The first circuit pattern 121 may be disposed on an upper surface of the first insulating layer 111, and thus the first circuit pattern 121 may be covered by the second insulating layer 112. The second circuit pattern 122 may be disposed on a lower surface of the first insulating layer 111, and thus the second circuit pattern 122 may be covered by the third insulating layer 113. The third circuit pattern 123 may be disposed on an upper surface of the second insulating layer 112, and thus the third circuit pattern 123 may be covered by the fourth insulating layer 114. The fourth circuit pattern 124 may be disposed on a lower surface of the third insulating layer 113, and thus the fourth circuit pattern 124 may be covered by the fifth insulating layer 115. The fifth circuit pattern 125 may be disposed on an upper surface of the fourth insulating layer 114, and thus the fifth circuit pattern 125 may be covered by the sixth insulating layer 116. The sixth circuit pattern 126 may be disposed on a lower surface of the fifth insulating layer 115, and thus the sixth circuit pattern 126 may be covered by the seventh insulating layer 117. The seventh circuit pattern 127 may be disposed on an upper surface of the sixth insulating layer 116, and thus the seventh circuit pattern 127 may be covered by the eighth insulating layer 118. The eighth circuit pattern 128 may be disposed on a lower surface of the seventh insulating layer 117, and thus the eighth circuit pattern 128 may be covered by the ninth insulating layer 119.

The outer layer circuit pattern may be disposed on a surface of the outermost insulating layer disposed on the outermost side of the insulating layer 110. Preferably, the outer layer circuit pattern may include a first outer layer circuit pattern 130 disposed on a lower surface of the ninth insulating layer 119 disposed at a lowermost portion of the insulating layer 110.

In addition, the outer layer circuit pattern may include a second outer layer circuit pattern 140 disposed on an upper surface of the eighth insulating layer 118 disposed on an uppermost portion of the insulating layer 110.

In this case, at least one of the first outer layer circuit pattern 130 and the second outer layer circuit pattern 140 may be formed to protrude above the surface of the insulating layer. Preferably, the first outer layer circuit pattern 130 may be formed to protrude below the lower surface of the ninth insulating layer 119. In addition, the second outer layer circuit pattern 140 may be formed to protrude above the upper surface of the eighth insulating layer 118.

That is, an upper surface of the first outer layer circuit pattern 130 may be positioned on the same plane as the lower surface of the ninth insulating layer 119. In addition, a lower surface of the second outer layer circuit pattern 140 may be positioned on the same plane as an upper surface of the primer layer 150 disposed on an upper surface of the eighth insulating layer 118.

In other words, the primer layer 150 may be disposed on the upper surface of the eighth insulating layer 118 and below the second outer layer circuit pattern 140.

That is, the second outer layer circuit pattern 140 may include a fine circuit pattern. Preferably, the second outer layer circuit pattern 140 may be a fine circuit pattern having a line width of 10 µm or less and an interval between patterns of 10 µm or less. Accordingly, when the second outer layer circuit pattern 140 is directly disposed on the eighth insulating layer 118, a contact area between the eighth insulating layer 118 and the second outer layer circuit pattern 140 is small, and thus a situation in which the second outer layer circuit pattern 150 is separated from the eighth insulating layer 118 may occur.

Therefore, in the embodiment, the primer layer 150 is disposed between the second outer layer circuit pattern 140 and the eighth insulating layer 118. The primer layer 150 may improve bonding force between the second outer layer circuit pattern 140 and the eighth insulating layer 118. The primer layer 150 may be disposed to entirely cover the upper surface of the eighth insulating layer 118. In addition, the second outer layer circuit pattern 140 may be partially disposed on the primer layer 150. Therefore, the upper surface of the primer layer 150 in an embodiment may include a first portion in contact with the second outer layer circuit pattern 140 and a second portion in contact with a lower surface of a solder resist 160 to be described later. That is, when the second outer layer circuit pattern 140 by the SAP process is formed, the primer layer 150 may serve to strengthen bonding force between the eighth insulating layer 118 and the second outer layer circuit pattern 140. Such a primer layer 150 may include a polyurethane-based resin, an acrylic resin, or a silicone-based resin, but the embodiment is not limited thereto.

Meanwhile, it is illustrated in FIG. 3 that the primer layer is not disposed between the ninth insulating layer 119 and the first outer layer circuit pattern 130, but the primer layer may also be formed between the ninth insulating layer 119 and the first outer layer circuit pattern 130. However, the first outer layer circuit pattern 130 may not be the fine circuit pattern, and accordingly, the primer layer between the ninth insulating layer 119 and the first outer layer circuit pattern 130 may be selectively omitted.

Consequently, when the fine circuit pattern is disposed on the inner layer, the primer layer may be omitted as the circuit pattern is covered by at least one of the insulating layers 110. On the other hand, in the embodiment, when the fine circuit pattern is disposed on the outermost layer, since there is no insulating layer covering the fine circuit pattern, the primer layer 150 is disposed in order to improve bonding force between the fine circuit pattern and the insulating layer.

Hereinafter, it will be described that the second outer layer circuit pattern 140 is formed of a fine circuit pattern. However, the embodiment is not limited thereto, and the first outer layer circuit pattern 130 may also be formed of the fine circuit pattern. It will be obvious that a structure for improving reliability, such as strengthening bonding force and preventing collapse of the second outer layer circuit pattern 140 described below, may also be applied to the first outer layer circuit pattern 130.

The inner layer circuit pattern 120, the first outer layer circuit pattern 130, and the second outer layer circuit pattern 140 may be wirings that transmit electrical signals and may be formed of a metal material having high electrical conductivity. To this end, the inner circuit pattern 120, the first outer layer circuit pattern 130, and the second outer layer circuit pattern 140 may be formed of at least one metal material selected from among gold (Au), silver (Ag), platinum (Pt), titanium (Ti), tin (Sn), copper (Cu), and zinc (Zn). In addition, the inner circuit pattern 120, the first outer layer circuit pattern 130, and the second outer layer circuit pattern 140 may be formed of paste or solder paste including at least one metal material selected from among gold (Au), silver (Ag), platinum (Pt), titanium (Ti), tin (Sn), copper (Cu), and zinc (Zn), which are excellent in bonding force. Preferably, the inner circuit pattern 120, the first outer layer circuit pattern 130, and the second outer layer circuit pattern 140 may be formed of copper (Cu) having high electrical conductivity and a relatively low cost.

At least one of the inner layer circuit pattern 120, the first outer layer circuit pattern 130, and the second outer layer circuit pattern 140 may be formed by a general process of manufacturing a circuit board, such as an additive process, a subtractive process, a modified semi additive process (MSAP), a semi additive process (SAP), etc., and detailed descriptions thereof will be omitted herein.

Preferably, the first outer layer circuit pattern 130 and the second outer layer circuit pattern 140 are outermost circuit patterns disposed on an outermost side of the circuit board, and thus they may be formed by the SAP (Semi Additive Process) method.

Meanwhile, a via V may be disposed in the insulating layer 110. The vias V are disposed in each insulating layer, and thus the via V may serve to electrically connect circuit patterns disposed in different layers to each other.

A first via V1 may be disposed in the first insulating layer 111. The first via V1 may electrically connect the first circuit pattern 121 disposed on the upper surface of the first insulating layer 111 and the second circuit pattern 122 disposed on the lower surface of the first insulating layer 111.

A second via V2 may be disposed in the second insulating layer 112. The second via V2 may electrically connect the first circuit pattern 121 disposed on the upper surface of the first insulating layer 111 and the third circuit pattern 123 disposed on the upper surface of the second insulating layer 112.

A third via V3 may be disposed in the third insulating layer 113. The third via V3 may electrically connect the second circuit pattern 122 disposed on the lower surface of the first insulating layer 111 and the fourth circuit pattern 124 disposed on the lower surface of the third insulating layer 113.

A fourth via V4 may be disposed in the fourth insulating layer 114. The fourth via V4 may electrically connect the third circuit pattern 123 disposed on the upper surface of the second insulating layer 111 and the fifth circuit pattern 125 disposed on the upper surface of the fourth insulating layer 114.

A fifth via V5 may be disposed in the fifth insulating layer 115. The fifth via V5 may electrically connect the fourth circuit pattern 124 disposed on the lower surface of the third insulating layer 113 and the sixth circuit pattern 126 disposed on the lower surface of the fifth insulating layer 115.

A sixth via V6 may be disposed in the sixth insulating layer 116. The sixth via V6 may electrically connect the fifth circuit pattern 125 disposed on the upper surface of the fourth insulating layer 114 and the seventh circuit pattern 127 disposed on the upper surface of the sixth insulating layer 116.

A seventh via V7 may be disposed in the seventh insulating layer 117. The seventh via V7 may electrically connect the sixth circuit pattern 126 disposed on the lower surface of the fifth insulating layer 115 and the eighth circuit pattern 128 disposed on the lower surface of the seventh insulating layer 117.

An eighth via V1 may be disposed in the eighth insulating layer 118. The eighth via V8 may electrically connect the seventh circuit pattern 127 disposed on the upper surface of the sixth insulating layer 116 and the second outer layer circuit pattern 140 disposed on the upper surface of the primer layer 150.

A ninth via V9 may be disposed in the ninth insulating layer 119. The ninth via V9 may electrically connect the eighth circuit pattern 128 disposed on the lower surface of the seventh insulating layer 117 and the first outer layer circuit pattern 130 disposed on the lower surface of the ninth insulating layer 119.

The via V as described above may be formed by filling the inside of a via hole formed in each insulating layer with a metal material.

The via hole may be formed by any one of mechanical, laser, and chemical processing method. When the via hole is formed by mechanical processing, a method such as milling, drilling and routing may be used, when the via hole is formed by laser processing, a method of UV or CO2 laser may be used, and when the via hole is formed by chemical processing, the insulating layer 110 may be opened using a chemical including aminosilane, ketone, or the like.

Meanwhile, the laser processing is a cutting method in which a part of a material is melted and evaporated by concentrating optical energy at a surface to take a desired shape. Complex formation by a computer program may be easily processed, and composite materials which are difficult to cut by other methods may be processed.

In addition, the processing by the laser may have a cutting diameter of at least 0.005 mm, and has a wide range of thickness that may be processed.

It is preferable to use an yttrium aluminum garnet (YAG) laser or CO2 laser or ultraviolet (UV) laser as the laser processing drill. The YAG laser is a laser capable of processing both a copper foil layer and an insulating layer, and the CO2 laser is a laser capable of processing only an insulating layer.

When the via hole is formed, the first to ninth vias V1, V2, V3, V4, V5, V6, V7, V8, and V9 may be formed by filling the inside of the via hole with a conductive material. The metal material forming the first to ninth vias V1, V2, V3, V4, V5, V6, V7, V8, and V9 may be any one material selected from among copper (Cu), silver (Ag), tin (Sn), gold (Au), nickel (Ni), and palladium (Pd), and the conductive material may be filled by any one of electroless plating, electrolytic plating, screen printing, sputtering, evaporation, ink jetting, and dispensing, or a combination thereof.

Meanwhile, a protective layer may be disposed on an outermost side of the circuit board 100. Preferably, a first protective layer 160 may be disposed on the eighth insulating layer 118 (preferably, on the primer layer 150). In addition, a second protective layer 175 may be disposed under the ninth insulating layer 119.

The first protective layer 160 and the second protective layer 175 may be formed of at least one layer using any one or more of solder resist (SR), oxide, and Au. Preferably, the first protective layer 160 and the second protective layer 175 may be a solder resist.

Meanwhile, the first protective layer 160 is disposed on the primer layer 150. The first protective layer 160 may serve to support the second outer layer circuit pattern 140 disposed on the primer layer 150 and protect a surface of the second outer layer circuit pattern 140.

That is, the first protective layer 160 may partially overlap the second outer layer circuit pattern 140 disposed on the primer layer 150. An area of the first protective layer 160 may be smaller than an area of the eighth insulating layer 118. The area of the first protective layer 160 may be smaller than an area of the primer layer 150. The first protective layer 160 is partially or entirely disposed on the primer layer 150 and the second outer layer circuit pattern 140, and thus the first protective layer 170 may include an open region exposing a surface of the second outer layer circuit pattern 140.

The first protective layer 160 may include an open region having a groove-like shape. Preferably, the first protective layer 160 includes an open region exposing a surface of the second outer layer circuit pattern 140 disposed in the first region R1 and the second region R2. In this case, the first region R1 and the second region R2 may be an open region where the surface of the second outer layer circuit pattern 140 is exposed. That is, a device mounting pad on which a chip device is mounted, a core pad or BGA pad serving as a die for connection to an external board, and a signal transfer wire trace, etc. are disposed in the first region R1 and the second region R2. In addition, the first protective layer 160 has an open region exposing surfaces of the device mounting pad, the core pad, and the BGA pad in the first region R1 and the second region R2.

In conclusion, the first region R1 and the second region R2 may mean a region in which the surface of the second outer layer circuit pattern 140 is exposed through the first protective layer 160 among an upper region of the primer layer 150 and the second outer layer circuit pattern 140.

That is, the circuit board includes a first region R1, a second region R2, and a third region R3. The first region R1 and the second region R2 are an open region where the surface of the second outer layer circuit pattern 140 should be exposed through the first protective layer 160, and the third region R3 may be a buried region where the surface of the second outer layer circuit pattern 140 is covered by the first protective layer 160.

That is, the first region R1 is a region in which the first pad 142 and the trace 141a to be electrically connected to a component such as a chip among the second outer layer circuit pattern 140 are disposed. Accordingly, the first protective layer 160 may have an open region exposing the surface of the first pad 142 included in the first region R1. In addition, the second region R2 sis a region in which the second pad 143 corresponding to a core pad or BGA pad serving as a die for bonding to an external board among the second outer layer circuit patterns 140 is disposed.

In addition, the second outer layer circuit pattern 140 disposed in the first region R1 as described above may have a reliability problem such as collapsing or rubbing due to various factors. Furthermore, the trace 141a of the second outer layer circuit pattern 140 is a fine circuit pattern, and thus the second outer layer circuit pattern 140 has a line width W1 of 10 μm or less and an interval of 10 μm or less and is disposed on the primer layer 150. Accordingly, the trace 141 disposed on the first region R1 may have a problem that it is easily collapsed or rubbed by various small external impacts.

Accordingly, in the embodiment, in order to improve reliability of the second outer layer circuit pattern 140 disposed on the first region R1, the first protective layer 160 is formed on the primer layer 150 corresponding to the first region R1.

That is, the first protective layer 160 may be disposed in a region of the upper surface of the primer layer 150 where the second outer layer circuit pattern 140 is not disposed. For example, the first protective layer 160 may be disposed on the upper surface of the primer layer 150, and thus the first protective layer 160 may be disposed between the second outer layer circuit patterns 140 on the first region R1.

In this case, the second outer layer circuit pattern 140 includes a second-first outer layer circuit pattern formed in the first region R1 and the second region R2 and a second-second outer layer circuit pattern formed in the third region R2.

In addition, an upper surface of the primer layer 150 may include a first upper surface corresponding to the first region R1, a second upper surface corresponding to the second region R2, and a third upper surface corresponding to the third region R3.

In this case, the first protective layer 160 may be entirely disposed on the primer layer 150 without dividing the first region R1, the second region R2 and the third region R3. That is, the first protective layer 160 may be respectively disposed in a region between the second-first outer layer circuit patterns and a region between the second-second outer layer circuit patterns.

Accordingly, the first protective layer 160 includes a first part disposed in the first region R1, a second part disposed in the second region R2 and a third part disposed in the third region R3.

In this case, the first protective layer 160 may have a step.

That is, a surface of the second outer layer circuit pattern 140 should be exposed to an outside in the first region R1 and the second region R2, and a surface of the second outer layer circuit pattern 140 should be covered with a protective layer in the third region R3.

Here, the second outer layer circuit pattern 140 disposed in the first region R1 and the second region R2 may have different widths according to functions. For example, the second outer layer circuit pattern 140 disposed in the first region R1 and the second region R2 may include the first pad 142, the second pad 143, and the trace 141 as described above.

In this case, the trace 141 may have a width of 10 μm or less. In addition, the first pad may have a width of about 45 μm. In addition, the second pad 143 may have a width W3 of 100 μm to 300 μm.

Accordingly, the embodiment forms the first protective layer 160 having different heights or structures with respect to a region where the trace 141 is disposed, a region where the first pad 142 is disposed, and a region where the second pad 143 is disposed in the open region of the solder resist.

The first protective layer 160 may include a first part disposed in the first region R1, a second part disposed in the second region R2, and a third part disposed in the third region R3. In addition, at least one of the first part, the second part, and the third part may have a height different from that of at least one other of the first part, the second part, and the third part.

For example, an upper surface of the first part disposed in the first region R1 may be positioned lower than an upper surface of the second part disposed in the second region R2 and an upper surface of the third part disposed in the third region R3.

In addition, an upper surface of the second part may be positioned higher than an upper surface of the first part. In addition, an upper surface of the second part may have the same height as an upper surface of the third part. That is, the upper surface of the second part and the upper surface of the third part may be positioned on the same plane.

Hereinafter, the first protective layer 160 will be described in detail.

The first protective layer 160 may be disposed on the primer layer 150. The first protective layer 160 is a solder resist.

The first protective layer 160 may be disposed between the second outer layer circuit patterns 140 on the primer layer 150. That is, the second outer layer circuit patterns 140 are disposed on the primer layer 150 at regular intervals. Also, the first protective layer 160 may be disposed on a region of an upper surface of the primer layer 150 where the second outer layer circuit pattern 140 is not disposed. In addition, the first protective layer 160 may be selectively disposed on the second outer layer circuit pattern 140.

Hereinafter, the first protective layer 160 will be described as a solder resist 160.

A solder resist 160 may be disposed on a region of the upper surface of the primer layer 150 on which the second outer layer circuit pattern 140 is not disposed.

Accordingly, a lower surface of the solder resist 160 may directly contact the upper surface of the primer layer 150. In addition, the solder resist 160 may have a structure in direct contact with the second outer layer circuit pattern 140.

For example, a first part of the solder resist 160 disposed in the first region R1 may directly contact a side surface of the second outer layer circuit pattern 140. In addition, the first part of the solder resist 160 disposed in the first region R1 may not contact an upper surface of the second outer layer circuit pattern 140. That is, the first part of the solder resist 160 disposed in the first region R1 may expose the upper surface of the second outer layer circuit pattern 140. Accordingly, a height of the first part of the solder resist 160 may be lower than a height of the second outer layer circuit pattern 140. Accordingly, the first part of the solder resist 160 disposed in the first region R1 may expose an entire upper surface of the second outer layer circuit pattern 140 and a part of the side surface of the second outer layer circuit pattern 140.

In addition, a second part of the solder resist 160 disposed in the second region R2 may directly contact a side surface of the second outer layer circuit pattern 140. In addition, the second part of the solder resist 160 disposed in the second region R2 may directly contact a part of the upper surface of the second outer layer circuit pattern 140. In addition, the second part of the solder resist 160 disposed in the second region R2 may expose an upper surface of the second outer layer circuit pattern 140.

In addition, a third part of the solder resist 160 disposed in the third region R3 may directly contact a side surface of the second outer layer circuit pattern 140. In addition, the third part of the solder resist 160 disposed in the third region R3 may directly contact an upper surface of the second outer layer circuit pattern 140. That is, the third part of the solder resist 160 disposed in the third region R3 may protrude above the upper surface of the second outer layer circuit pattern 140 with a predetermined height and cover the second outer layer circuit pattern 140. In detail, the third part of the solder resist 160 disposed in the third region R3 may be disposed while surrounding the side surface and upper surface of the second outer layer circuit pattern 140.

Meanwhile, the second outer layer circuit pattern 140 according to the embodiment may have different heights for each region. Meanwhile, the second outer layer circuit pattern 140 may include a trace 141, a first pad 142 and a second pad 142 as described above.

In this case, the first pad 142 may be disposed in the first region R1. In addition, the second pad 142 may be disposed in the second region R2. In addition, the trace 141 may include a first trace 141a disposed in the first region R1 and a second trace 141b disposed in the third region R3.

In addition, a height of the first trace 141a may be different from a height of the second trace 141b.

The first trace 141a may have a first height H1. The first height H1 of the first trace 141a may be 14.5 μm to 16.25 μm.

The second trace 141b may have a second height H2 greater than the first height H1. The second height H2 may be 16 µm to 17 µm. Here, a height difference between the first trace 141a and the second trace 141b may be 0.75 µm to 1.5 µm.

For example, the first height H1 of the first trace 141a may satisfy a range of 90% to 95% of the second height H2 of the second trace 141b.

That is, the first height H1 of the first trace 141a in the embodiment is smaller than the second height H2 of the second trace H2. This is because the first trace 141a formed in the first region R1 is etched to remove a remaining resin on the upper surface of the first trace 141a. In other words, the first part of the solder resist 160 is removed through a thinning process while being disposed on the first region R1 while covering the first trace 141a, and accordingly, the first part of the solder resist 160 has a height lower than that of the first trace 141a. In this case, a resin remaining on the surface of the first trace 141a is not completely removed in the thinning process, which may cause a reliability problem. Therefore, in the embodiment, an etching process is performed on the surface of the first trace 141a to completely remove the remaining resin.

When the first height H1 of the first trace 141a is less than 90% of the second height H2 of the second trace 141b, this means that over-etching of the first trace 141a has progressed, and thus a reliability problem may occur due to deformation of the shape of the first trace 141a. In addition, when the first height H1 of the first trace 141a is 95% greater than the second height H2 of the second trace 141b, this means that the etching of the first trace 141a is insufficient, and thus a reliability problem may occur due to resin remaining on the surface of the first trace 141a. Therefore, in the embodiment, the first height H1 of the first trace 141a satisfies a range of 90% to 95% of the second height H2 of the second trace 141b, and thus the reliability problem to solve.

The first part of the solder resist 160 may have a third height H3. The third height H3 may be smaller than the first height H1. For example, the third height H3 of the first part of the solder resist 160 may satisfy 70% to 85% of the first height H1 of the first trace 141a. For example, when the third height H3 of the first part of the solder resist 160 is less than 70% of the first height H1 of the first trace 141a, the first part of the solder resist 160 may not stably support the first trace 141a. For example, when the third height H3 of the first part of the solder resist 160 is less than 70% of the first height H1 of the first trace 141a, an area of a protruding portion of the first trace 141a on the surface of the solder resist 160 increases, and accordingly, it may not be easy to control the etching process of the first trace 141a. That is, when the area of the protruding portion of the first trace 141a on the surface of the solder resist 160 is increased, it is difficult to precisely etch only a desired height in the etching process. For example, when the area of the protruding portion of the first trace 141a on the surface of the solder resist 160 is increased, more etching than the desired height is performed in the etching process, and accordingly, a reliability problem in which shape deformation (eg, crushing) of the first trace 141a becomes severe may occur.

Meanwhile, the third part of the solder resist 160 may have a fourth height H4. A fourth height H4 of the third part of the solder resist 160 is greater than the first height H1, the second height H2, and the third height H3.

In this case, the third part of the solder resist 160 is disposed to cover the second outer layer circuit pattern 140 in order to stably protect the second outer layer circuit pattern 140. In this case, the fourth height H2 may be 20 µm to 40 µm. When the fourth height H4 is less than 20 µm, the second outer layer circuit pattern 140 buried in the third part of the solder resist 160 cannot be stably protected from various factors. In addition, when the fourth height H4 is greater than 40 µm, an overall thickness of the circuit board may increase. In addition, when the fourth height H4 is greater than 40 µm, a manufacturing cost of the circuit board may increase.

Meanwhile, the second part of the solder resist 160 disposed in the second region R2 may include an opening region. The second part of the solder resist 160 may be disposed in the second region R2 and may have an opening region exposing a portion of an upper surface of the second pad 143. In addition, the second part of the solder resist 160 may be disposed while covering a part of an upper surface of the second pad 143. In this case, a height of the second part of the solder resist 160 may correspond to a height of the third part of the solder resist 160.

That is, the second outer layer circuit pattern 140 included in the second region R2 is the second pad 143. As described above, the second pad 143 may be a BGA pad or a core pad. Accordingly, a width of the second pad 143 may be relatively greater than that of other pads. For example, the second pad 143 may have a width W3 of 100 µm to 300 µm. In addition, since the second pad 143 has a relatively large width, it is not greatly affected by exposure resolution. That is, since the second pad 143 has a relatively large width, there is no problem in reliability even if only a part of the upper surface of the second pad 143 is exposed. In other words, even if only a part of the upper surface of the second pad 143 is exposed, a function of the die for bonding with another external board is not greatly affected. Accordingly, the second part of the solder resist 160 may be disposed while covering a part of the upper surface of the second pad 143 as described above. In detail, the second part of the solder resist 160 has a fourth height H4 equal to a height of the first part and protrudes from the upper surface of the second pad 143, and the second part of the solder resist 160 has an opening region exposing a part of the upper surface of the second pad 143.

Meanwhile, an etching process for removing remaining resin may also be performed on the second pad 143 along with the first trace 141a. Accordingly, an upper surface of the second pad 143 may have a step. That is, the second pad 143 may include a first portion covered by the second part of the solder resist 160 and a second portion exposed by the opening region of the second part of the solder resist 160. In addition, the first portion and the second portion of the second pad 143 may have different heights.

In addition, the first portion of the second pad 143 may have a fifth height H5. In addition, the second portion of the second pad 143 may have a sixth height H6 smaller than the fifth height H5. A sixth height H6 of the second portion of the second pad 143 may be 14.5 µm to 16.25 µm.

In addition, the first portion of the second pad 143 may have a fifth height H5 greater than the sixth height H6. The fifth height H5 may be 16 µm to 17 µm. Here, a height difference between the first and second portions of the second pad 143 may be 0.75 µm to 1.5 µm.

For example, the sixth height H6 of the second portion of the second pad may satisfy a range of 90% to 95% of the fifth height H5 of the first portion of the second pad 143.

That is, the sixth height H6 of the second portion of the second pad 143 in the embodiment is smaller than the fifth height H5 of the first portion of the second pad 143. This is because the second part of the second pad 143 exposed through the opening region of the second part of the solder resist 160 is etched to remove the resin remaining on the upper surface of the second pad 143. In other words, the second part of the solder resist 160 is removed through a thinning process while being disposed on the second region R2 while covering the second pad 143, and accordingly, the second part of the solder resist 160 may include the opening region. In this case, the resin remaining on the surface of the second pad 143 is not completely removed in the thinning process, which may cause a reliability problem. Therefore, in the embodiment, an etching process is performed on the surface of the second portion of the second pad 143 to completely remove the remaining resin.

In this case, etching of the second pad 143 may be performed together with the first trace 141a. Accordingly, an etching condition of the second pad 143 may correspond to an etching condition of the first trace 141a.

Accordingly, when the sixth height H6 of the second portion of the second pad 143 is smaller than 90% of the fifth height H5 of the first portion of the second pad 143, this means that over-etching of the second portion of the second pad 143 has progressed, and thus a reliability problem may occur due to deformation of the shape of the second portion of the second pad 143. In addition, when the sixth height H6 of the second portion of the second pad 143 is 95% greater than the fifth height H5 of the first portion of the second pad 143, this means that the etching of the second portion of the second pad 143 is insufficient, and thus a reliability problem may occur due to resin remaining on the surface of the second portion of the second pad 143. Therefore, in the embodiment, the sixth height H6 of the second portion of the second pad 143 satisfies a range of 90% to 95% of the fifth height H5 of the first portion of the second pad 143, and thus the reliability problem to solve.

Meanwhile, the first pad 142 may have the same height as the second portion of the second pad 143. That is, the first pad 142 may have a height lower than that of the first portion of the second pad 143. That is, the first pad 142 is etched together with the second part of the second pad 143, and accordingly, the first pad 142 may have a seventh height H7 corresponding to the sixth height H6 of the second portion of the second pad 143.

A photo solder resist film may be used as the solder resist 160. The solder resist 160 may have a structure in which a resin and a filler are mixed.

For example, the solder resist 160 may include a filler such as $BaSO_4$, $SiO_2$, or Talc, and a content of the filler may have a range of 20 wt. % to 35 wt. %.

In this case, when the content of the filler included in the solder resist 160 is less than 20 wt. %, the second outer layer circuit pattern 140 may not be stably protected by the solder resist 160. In addition, when the content of the filler included in the solder resist 160 is greater than 35 wt. %, a part of the filler may remain on the second outer layer circuit pattern 140 when the solder resist 160 is developed.

That is, a protective layer including the solder resist 160 according to the embodiment will be described. Here, the solder resist 160 may be a protective layer protecting the surface of the second outer layer circuit pattern 140 in the third region R3, and the solder resist 160 may be a support layer supporting the second outer layer circuit pattern 140 in the first region R1.

In this case, a comparative example includes a circuit pattern disposed on the insulating layer with a protruding structure. In addition, the circuit pattern may be independently disposed on the insulating layer without being supported by another support layer. Accordingly, collapse or chafing of the circuit pattern occurs in a region corresponding to the fine pattern in the comparative example.

This may occur in a circuit pattern of an outermost layer of the circuit board including the circuit pattern manufactured by the SAP method.

In contrast, a primer layer 150 is disposed on the eighth insulating layer 118 of the embodiment, and a second outer layer circuit pattern 140 is disposed on the primer layer 150.

In addition, first to third parts of the solder resist 160 serving as a support layer and a protective layer are disposed on the primer layer 150 while surrounding the second outer layer circuit pattern 140.

In this case, the solder resist 160 may be disposed on the first region R1, the second region R2, and the third region R3. The solder resist 160 may support the second outer layer circuit pattern 140 disposed on the outermost layer of the circuit board 100, and in particular, the solder resist 160 supports the trace 141a and the first pad 142 of the second outer layer circuit pattern 140 disposed in the first region R1. Accordingly, the second outer layer circuit pattern 140 may be protected from external impact.

Meanwhile, as described above, in the embodiment, a residual resin removal process is performed by performing an etching process on the second outer layer circuit pattern 140 exposed through the first region R1 and the second region R2. Accordingly, the second trace 141b disposed in the third region R3 and the first trace 141a disposed in the first region R1 have different heights.

At this time, the etching should not cause deformation of the second outer layer circuit pattern 140 while completely removing the residual resin. That is, if a degree of etching is insufficient, residual resin may exist on the surface of the second outer layer circuit pattern 140 despite the progress of the etching. In addition, if the degree of etching is excessive, deformation (eg, surface crushing, etc.) of the second outer layer circuit pattern 140 may occur due to the etching, and thus a reliability problem may occur.

FIGS. 7 and 8 are views showing a degree of residual resin according to a degree of etching.

Referring to FIG. 7, FIG. 7 (a) is a view showing a surface of the second outer layer circuit pattern 140 after etching under a first condition. FIG. 7 (b) is an enlarged view of FIG. 7(a). Specifically, FIGS. 7 (a) and (b) are views showing a surface of the second outer layer circuit pattern 140 in the case where a height of about 0.5 μm is etched.

At this time, even after etching the surface of the second outer layer circuit pattern 140 by about 0.5 μm, it was confirmed that residual resin remained on the surface of the second outer layer circuit pattern 140.

That is, surface properties of the second outer layer circuit patterns 140 after etching the second outer layer circuit patterns 140 under the first condition are shown in Table 1 below.

TABLE 1

| elements | Wt % |
|---|---|
| C | 20.41 |
| N | 2.02 |
| Cl | 2.23 |
| Cu | 74.44 |

As shown in Table 1, the surface properties of the second outer layer circuit pattern 140 after etching with a height of 0.5 μm were confirmed to include less than 80 wt % of Cu. In addition, as shown in Table 1, it was confirmed that 20 wt % or more of C corresponding to the solder resist was present in the surface properties of the second outer layer circuit pattern 140 after etching with a height of 0.5 μm.

Referring to FIG. 8, FIG. 8 (a) is a view showing a surface of the second outer layer circuit pattern 140 after etching under a second condition. FIG. 8 (b) is an enlarged view of FIG. 8 (a). Specifically, FIGS. 8 (a) and (b) are views showing the surface of the second outer layer circuit pattern 140 in the case where a height of about 0.75 μm to about 0.95 μm is etched.

In this case, after etching the surface of the second outer layer circuit pattern 140 to a height of about 0.75 μm to 0.95 μm, it was confirmed that no residual resin remained on the surface of the second outer layer circuit pattern 140.

That is, surface properties of the second outer layer circuit pattern 140 after etching the second outer layer circuit pattern 140 under the second condition are as shown in Table 2 below.

TABLE 2

| Elements | Wt % |
|---|---|
| C | 16.56 |
| N | 1.48 |
| Cl | 1.88 |
| Cu | 80.08 |

As shown in Table 2, the surface properties of the second outer layer circuit pattern 140 after etching with a height of 0.75 μm to 0.95 μm were confirmed to include 80 wt % or more of Cu. In addition, as shown in Table 2, it was confirmed that the surface properties of the second outer layer circuit pattern 140 after etching with a height of 0.75 μm to 0.95 μm were such that C corresponding to the solder resist was present at 20 wt % or less. When the second outer layer circuit pattern 140 is etched to a height of 0.95 μm to 0.95 μm, it means that the resin remaining on the surface of the second outer layer circuit pattern 140 is completely removed.

Here, in Table 2, it has been described that the second outer layer circuit pattern 140 is etched at a height of 0.75 μm to 0.95 μm, and this may be substantially determined by the height of the second outer layer circuit pattern 140 initially formed. That is, the etching degree may progress to a height of 5% to 10% of the initially formed second outer layer circuit pattern 140.

FIG. 9 is a view showing a shape according to an etching state of a second outer layer circuit pattern according to an embodiment.

Referring to FIG. 9, FIG. 9 (a) shows a shape change of trace 141 after etching to about 0.5 μm, and FIG. 9 (b) shows a shape change of trace 141 after etching to about 0.75 μm to 0.95 μm.

As shown in FIG. 8, even after the trace 141 is etched to a height of about 0.75 μm to 0.95 μm, although a change in the shape of the surface occurred, it was confirmed that there was no problem in reliability, and it was confirmed that the resin remaining on the surface was also completely removed.

FIGS. 10 to 17 are views showing a method of manufacturing the circuit board shown in FIG. 2 in order of process.

Referring to FIG. 10, in the embodiment, first, a process of manufacturing an inner substrate 100-1 for manufacturing an inner portion of the circuit board 100 may be performed.

The process for manufacturing the inner layer substrate 100-1 will be briefly described.

The inner layer substrate 100-1 may include one insulating layer, or alternatively, a plurality of insulating layers.

It is illustrated in FIG. 10 that the inner-layer substrate 100-1 has an insulating layer structure with seven layers, but the embodiment is not limited thereto. For example, the inner layer substrate 100-1 may include an insulating layer less than seven layers, or alternatively, more than seven layers.

The inner layer substrate 100-1 may include remaining insulating layers excluding an insulating layer disposed on an outermost layer of the circuit board 100. For example, the inner layer substrate 100-1 may include an insulating layer disposed on an uppermost portion of the circuit board 100 and remaining insulating layers excluding an insulating layer disposed on a lowermost portion of the circuit board 100.

Briefly describing the process of manufacturing the inner layer substrate 100-1, first, the first insulating layer 111 is prepared.

Then, when the first insulating layer 111 is prepared, a first via V1 is formed in the first insulating layer 111, and a circuit pattern 121 and a second circuit pattern 122 are formed on upper and lower surfaces of the first insulating layer 111, respectively.

Thereafter, a second insulating layer 112 is formed on the first insulating layer 111, and a third insulating layer 113 is formed under the first insulating layer 111.

Next, a second via V2 is formed in the second insulating layer 112, and a third circuit pattern 123 is formed on an upper surface of the second insulating layer 112.

In addition, a third via V3 is formed in the third insulating layer 113, and a fourth circuit pattern 124 is formed under a lower surface of the third insulating layer 113.

Thereafter, a fourth insulating layer 114 is formed on the second insulating layer 112, and a fifth insulating layer 115 is formed under the third insulating layer 113.

Next, a fourth via V4 is formed in the fourth insulating layer 114, and a fifth circuit pattern 125 is formed on an upper surface of the fourth insulating layer 114. In addition, a fifth via V5 is formed in the fifth insulating layer 115, and a sixth circuit pattern 126 is formed under a lower surface of the fifth insulating layer 115.

Thereafter, a sixth insulating layer 116 is formed on the fourth insulating layer 114, and a seventh insulating layer 117 is formed under the fifth insulating layer 115.

Next, a sixth via V6 is formed in the sixth insulating layer 116, and a seventh circuit pattern 127 is formed on an upper surface of the sixth insulating layer 116. In addition, a seventh via V7 is formed in the seventh insulating layer 117, and an eighth circuit pattern 128 is formed under a lower surface of the seventh insulating layer 117.

Since the process of manufacturing the inner layer substrate 100-1 is a known technique in a technical field to which the present invention pertains, a detailed description thereof will be omitted.

Referring to FIG. 11, when the inner layer substrate 100-1 is manufactured, an eighth insulating layer 118 corresponding to a first outermost insulating layer is formed on an upper surface of the inner layer substrate 100-1. In addition, a ninth insulating layer 119 corresponding to a second outermost insulating layer is formed under a lower surface of the inner layer substrate 100-1.

In this case, when the eighth insulating layer 118 and the ninth insulating layer 119 are stacked, a primer layer 150 may be respectively disposed on the upper surface of the eighth insulating layer 118 and the lower surface of the ninth insulating layer 119, and a metal layer 155 may be disposed on the primer layer 150. The metal layer 155 may serve to planarize the eighth insulating layer 118 and the ninth insulating layer 119 to have uniform heights. For example, the metal layer 155 may be disposed in order to improve stacking reliability of the eighth insulating layer 118 and the ninth insulating layer 119.

The primer layer 150 may serve to increase bonding force between a first outer layer circuit pattern 130 and a second outer layer circuit pattern 140 that are disposed on and under the eighth insulating layer 118 and the ninth insulating layer 119, respectively. That is, when the first outer layer circuit pattern 130 and the second outer layer circuit pattern 140 are disposed without the primer layer 150, the bonding force between the eighth insulating layer 118 and the second outer layer circuit pattern 140 is low, and thus they may be separated from each other.

Meanwhile, it is illustrated in FIG. 11 that the primer layer 150 is respectively disposed on the upper surface of the eighth insulating layer 118 and the lower surface of the ninth insulating layer 119, but the embodiment is not limited thereto. For example, the primer layer 150 may be selectively disposed on a surface of an insulating layer on which a fine circuit pattern is to be disposed. That is, when only the first outer layer circuit pattern 130 is a fine circuit pattern, the primer layer 150 may be disposed only on the lower surface of the ninth insulating layer 119. In addition, when only the second outer layer circuit pattern 140 is a fine circuit pattern, the primer layer 150 may be disposed only on the upper surface of the eighth insulating layer 118. In addition, when the first outer layer circuit pattern 130 and the second outer layer circuit pattern 140 are both fine circuit patterns, the primer layer 150 may be disposed on both the upper surface of the eighth insulating layer 118 and the lower surface of the ninth insulating layer 119.

Referring to FIG. 12, when the eighth insulating layer 118 and the ninth insulating layer 119 are disposed, a via hole VH is respectively formed in the eighth insulating layer 118 and the ninth insulating layer 119. In this case, the via hole VH may be respectively formed not only in the eighth insulating layer 118 and the ninth insulating layer 119 but also in the primer layer 150 and the metal layer 155.

Next, referring to FIG. 13, when the via hole VH is formed, an etching process of removing the metal layer 155 disposed on the primer layer 150 may be performed. For example, after the via hole VH is formed, a flash etching process may be performed to remove the metal layer 155, and thus a process for exposing a surface of the primer layer 150 may be performed.

Next, referring to FIG. 14, a via V forming process for filling the via hole VH may be performed, and thus the second outer layer circuit pattern 140 may be formed on the upper surface of the eighth insulating layer 118, and the lower outer layer circuit pattern 130 may be formed on the lower surface of the ninth insulating layer 119. In this case, in the embodiment, it is illustrated that the first outer layer circuit pattern 130 is a general circuit pattern rather than a fine circuit pattern, but the embodiment is not limited thereto, and the first outer layer circuit pattern 130 together with the second outer layer circuit pattern may be a fine circuit pattern. Accordingly, when the first outer layer circuit pattern 130 is a general circuit pattern, the primer layer 150 between the ninth insulating layer 119 and the first outer layer circuit pattern 130 may be omitted.

An upper outer layer circuit pattern 140 is disposed on the upper surface of the eighth insulating layer 118. In this case, the upper outer layer circuit pattern 140 disposed on the upper surface of the eighth insulating layer 118 includes a portion disposed in the open region R1 and R2 of the first protective layer 170 and a portion disposed in an arrangement region R3 of the first protective layer 170. In addition, traces and pads, which are wiring lines for signal transmission, may be disposed in each of the regions R1, R2 and R3.

In detail, the trace 141 and the first pad 142 may be disposed in the first region R1. The first pad 142 may be a mounting pad on which a device is mounted.

In addition, a second pad 143 may be disposed in a second region R2. The second pad 143 may be a BGA pad or a core pad. In particular, the second pad 143 may have a greater width than the first pad 142. Therefore, the second pad 143 is not greatly affected by a development resolution, and accordingly, a solder resist 170 having a shape different from that of the solder resist 170 disposed in the first region R1 may be disposed.

Meanwhile, the trace 141 may include a first trace 141a disposed in the first region R1 and a second trace 141b disposed in the second region R2.

Next, referring to FIG. 15, a solder resist layer is disposed on the primer layer 150 to cover the upper outer layer circuit pattern 140. In this case, the solder resist layer may be disposed in both the first region R1, the second region R2 and the third region R3 and may be formed to have a height greater than that of the upper outer layer circuit pattern 140.

Referring to FIG. 16, when the solder resist layer is formed, the solder resist layer may be exposed and developed to form solder resists 160 having different heights for each region. Preferably, the embodiment exposes a part of the second region R2 and the whole of the third region R3 of the solder resist layer, and accordingly, a process of developing the entire first region R1 and a portion of the second region R2 of the solder resist layer may be performed.

To this end, UV exposure is performed by masking only a desired region on the solder resist layer, and then the solder resist 160 may be formed by performing a process of adjusting the height of the solder resist layer in an unexposed region by dipping in an organic alkaline compound containing tetramethylammonium hydroxide (TMAH) or trimethyl-2-hydroxyethylammonium hydroxide (choline), etc. In this case, a height of the solder resist layer in the second region R2 may be adjusted based on a height of the second outer layer circuit pattern 140. For example, a height of the solder resist layer in the second region R2 may be 70% to 85% of a height of the second outer layer circuit pattern 140.

Next, referring to FIG. 17, a process of etching the first trace 141a and the first pad 142 disposed in the first region R1 and the second pad 143 disposed in the second region R2 may be performed. The etching process may be a process of removing resin remaining on surfaces of the first trace 141a, the first pad 142, and the second pad 143.

The characteristics, structures, effects, and the like described in the above-described embodiments are included in at least one embodiment, but are not limited to only one embodiment. Furthermore, the characteristic, structure, and effect illustrated in each embodiment may be combined or modified for other embodiments by a person skilled in the art. Therefore, it should be construed that contents related to such combination and modification are included in the scope of the embodiment.

Embodiments are mostly described above, but the embodiments are merely examples and do not limit the embodiments, and a person skilled in the art may appreciate that several variations and applications not presented above may be made without departing from the essential characteristic of embodiments. For example, each component specifically represented in the embodiments may be varied. In addition, it should be construed that differences related to such a variation and such an application are included in the scope of the embodiment defined in the following claims.

The invention claimed is:

1. A circuit board comprising:
   a build-up insulating layer including a plurality of insulating layers laminated along a vertical direction;
   a circuit layer disposed on the build-up insulating layer; and
   a protective layer disposed on the circuit layer and including a first region having a first thickness in the vertical direction and a second region having a second thickness greater than the first thickness in the vertical direction,
   wherein the circuit layer includes a first circuit pattern passing through the first region of the protective layer and a second circuit pattern disposed in the second region of the protective layer,
   wherein the protective layer includes a through hole passing through the second region,
   wherein the second circuit pattern includes a pad part overlapping the through hole along the vertical direction,
   wherein an upper surface of the pad part includes a first portion overlapping the through hole along the vertical direction and a second portion connected to the first portion and not overlapping the through hole along the vertical direction, and
   wherein a height of the first portion of the pad part is same as a height of the first circuit pattern;
   wherein the upper surface of the pad part has a step, and the uppper surface of the first circuit pattern does not have a step.

2. The circuit board of claim 1, wherein a height of the second portion of the pad part is greater than the height of the upper surface of the first circuit pattern based on the build-up insulating layer.

3. The circuit board of claim 1, wherein the
   second circuit pattern further includes an embedded pattern embedded in the second region of the protective layer without overlapping the through hole along the vertical direction.

4. The circuit board of claim 3, wherein an upper surface of the embedded pattern does not have a step.

5. The circuit board of claim 4, wherein a height of an upper surface of the embedded pattern is same as a height of the second portion of the pad part.

6. The circuit board of claim 4, wherein
   a height of an upper surface of the embedded pattern is greater than the height of the upper surface of the first circuit pattern based on the build-up insulating layer.

7. The circuit board of claim 4, wherein a height of an upper surface of the embedded pattern is greater than the height of the first portion of the pad part based on the build-up insulating layer.

8. The circuit board of claim 3, wherein
   a thickness of the first circuit pattern embedded pattern is satisfies a range of 90% to 95% of a thickness of the embedded pattern.

9. The circuit board of claim 1, wherein a thickness of the first region of the protective layer satisfies a range of 70% to 85% of a thickness of the first pattern.

10. The circuit board of claim 1, wherein a surface roughness of an upper surface of the first region of the protective layer is greater than a surface roughness of an upper surface of the second region of the protective layer.

* * * * *